US009665481B2

(12) United States Patent
Tan

(10) Patent No.: US 9,665,481 B2
(45) Date of Patent: May 30, 2017

(54) WEAR LEVELING METHOD BASED ON TIMESTAMPS AND ERASE COUNTS, MEMORY STORAGE DEVICE AND MEMORY CONTROL CIRCUIT UNIT

(71) Applicant: PHISON ELECTRONICS CORP., Miaoli (TW)

(72) Inventor: Kok-Yong Tan, Miaoli County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 107 days.

(21) Appl. No.: 14/824,092

(22) Filed: Aug. 12, 2015

(65) Prior Publication Data

US 2017/0010961 A1  Jan. 12, 2017

(30) Foreign Application Priority Data

Jul. 7, 2015  (TW) .............................. 104122031 A

(51) Int. Cl.
*G06F 13/00* (2006.01)
*G06F 12/02* (2006.01)
(Continued)

(52) U.S. Cl.
CPC ...... *G06F 12/0246* (2013.01); *G11C 16/3495* (2013.01); *G06F 2212/7201* (2013.01);
(Continued)

(58) Field of Classification Search
CPC ......... G06F 12/0246; G06F 2212/7211; G06F 2212/7201; G06F 2212/7205;
(Continued)

(56) References Cited

U.S. PATENT DOCUMENTS

| | | | |
|---|---|---|---|
| 2012/0054419 A1* | 3/2012 | Chen | G06F 11/1441 711/103 |
| 2013/0128666 A1* | 5/2013 | Avila | G06F 11/1048 365/185.11 |

(Continued)

FOREIGN PATENT DOCUMENTS

| TW | 201503154 | 1/2015 |
|---|---|---|
| TW | I486767 | 6/2015 |

OTHER PUBLICATIONS

"Office Action of Taiwan Counterpart Application", issued on Jun. 21, 2016, p. 1-p. 6, in which the listed references were cited.

*Primary Examiner* — Hong Kim
(74) *Attorney, Agent, or Firm* — Jianq Chyun IP Office

(57) ABSTRACT

A wear leveling method for a rewritable non-volatile memory module is provided. The method includes: recording a timestamp for each of physical erasing units storing valid data according to a programming sequence of the physical erasing units storing valid data among the physical erasing units, and recording an erase count for each of physical erasing units. The method also includes: selecting a first physical erasing unit from the physical erasing units storing valid data according to the timestamps, selecting a second physical erasing unit from physical erasing units not storing valid data among the physical erasing units according to the erase counts, and writing valid data of the first physical erasing unit into the second physical erasing unit, and marking the first physical erasing unit as a physical erasing unit not storing valid data.

21 Claims, 14 Drawing Sheets

(51) Int. Cl.
*G11C 16/16* (2006.01)
*G11C 16/00* (2006.01)
*G11C 16/34* (2006.01)

(52) U.S. Cl.
CPC ............... *G06F 2212/7205* (2013.01); *G06F 2212/7211* (2013.01); *G11C 16/00* (2013.01); *G11C 16/16* (2013.01); *G11C 16/349* (2013.01)

(58) Field of Classification Search
CPC ..... G11C 16/16; G11C 16/00; G11C 16/3495; G11C 16/349
USPC .......................... 707/813, 693; 711/103, 170
See application file for complete search history.

(56) References Cited

U.S. PATENT DOCUMENTS

| | | | |
|---|---|---|---|
| 2014/0236911 A1* | 8/2014 | Bodwin | G06F 17/3023 707/695 |
| 2014/0237168 A1* | 8/2014 | Prins | G06F 13/1657 711/103 |
| 2014/0372675 A1* | 12/2014 | Higeta | G06F 12/0246 711/103 |
| 2015/0081960 A1 | 3/2015 | Chen et al. | |

\* cited by examiner

WEAR LEVELING METHOD BASED ON TIMESTAMPS AND ERASE COUNTS, MEMORY STORAGE DEVICE AND MEMORY CONTROL CIRCUIT UNIT

CROSS-REFERENCE TO RELATED APPLICATION

This application claims the priority benefit of Taiwan application serial no. 104122031, filed on Jul. 7, 2015. The entirety of the above-mentioned patent application is hereby incorporated by reference herein and made a part of this specification.

BACKGROUND

1. Technology Field

The present invention relates to a wear leveling method, and particularly relates to a wear leveling method for a non-volatile memory module, a memory storage device, and a memory control circuit unit.

2. Description of Related Art

The growth of digital cameras, mobile phones, and MP3 players has been rapid in recent years. Consequently, the consumers' demand for storage media has increased tremendously. Since the rewritable non-volatile memory has the characteristics of data non-volatility, low power consumption, compact size, non-mechanical structure, and fast reading/writing speed, the rewritable non-volatile memory has gained its popularity in electronic industry in recent years. For example, solid-state drives using flash memory as storage medium are already broadly used as hard drives of computers, so as to improve an overall access performance of the computers.

Generally speaking, to prolong the lifetime of the rewritable non-volatile memory, the physical erasing units in the rewritable non-volatile memory should be used as evenly as possible. For example, the physical erasing units in the rewritable non-volatile memory may be divided into a data area and a spare area. A conventional wear leveling method is to switch the physical erasing units in the data area and the spare area after the rewritable non-volatile memory is operated for a fixed period of time or at a fixed time point, so that the physical erasing unit with a lower erase count in the data area may be changed to the spare area to be programmed or written.

When the physical erasing unit with a lower erase count in the data area is changed to the spare area, a physical erasing unit with a higher erase count is selected to be changed from the spare area to the data area. However, if the data stored in the physical erasing unit are data that are updated frequently, it is likely that the physical erasing unit is associated to the spare area again when the data are updated. However, in the next wear leveling operation, the physical erasing unit that is associated to the spare area again has a higher chance to be changed to the data area again because this physical erasing unit has an erase count higher than other physical erasing units. Thus, the physical erasing units of the rewritable non-volatile memory module are not used evenly. Thus, how to select the physical erasing unit for the wear leveling process to make the physical erasing units used evenly and thus effectively prolong the lifetime of the rewritable non-volatile memory is an issue that people having ordinary skills in the art should work on.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a wear leveling method, a memory storage device, and a memory control circuit unit capable of effectively keeping wear levels of physical erasing units even to prolong a lifetime of the memory storage device.

An exemplary embodiment of the present invention provides a wear leveling method for a rewritable non-volatile memory module, and the rewritable non-volatile memory module includes a plurality of physical erasing units. The wear leveling method includes recording a timestamp for each of the physical erasing units storing valid data according to a programming sequence of physical erasing units storing valid data among the physical erasing units. The wear leveling method also includes recording an erase count for each of the physical erasing units and selecting a first physical erasing unit from the physical erasing units storing valid data according to the timestamps the physical erasing units. In addition, the wear leveling method further includes getting a second physical erasing unit from the physical erasing units not storing valid data according to the erase count of each of the physical erasing units, and writing the valid data in the first physical erasing unit into the second physical erasing unit and marking the first physical erasing unit as one of the physical erasing units not storing valid data.

An exemplary embodiment of the present invention provides a memory control circuit unit for controlling a rewritable non-volatile memory module. The rewritable non-volatile memory module includes a plurality of physical erasing units. The memory control circuit unit includes a host interface, a memory interface, and a memory management circuit. The host interface is coupled to a host system, the memory interface is coupled to the rewritable non-volatile memory module, and the memory management circuit is coupled to the host interface and the memory interface. The memory management circuit records a timestamp for each of the physical erasing units storing valid data according to a programming sequence of the physical erasing units storing valid data among the physical erasing units. The memory management circuit records an erase count for each of the physical erasing units. The memory management circuit further selects a first physical erasing unit from the physical erasing units storing valid data according to the timestamps the physical erasing units, and gets a second physical erasing unit from the physical erasing units not storing valid data according to the erase count of each of the physical erasing units. The memory management circuit further sends a first command sequence instructing to write the valid data in the first physical erasing unit into the second physical erasing unit, and the memory management circuit marks the first physical erasing unit as a physical erasing unit not storing valid data.

An exemplary embodiment of the present invention provides a memory storage device. The memory storage device includes a connecting interface unit, a rewritable non-volatile memory module, and a memory control circuit unit. The connecting interface unit is coupled to a host system. The rewritable non-volatile memory module includes a plurality of physical erasing units. The memory control circuit unit is coupled to the connecting interface unit and the rewritable non-volatile memory module. The memory control circuit unit records a timestamp for each of the physical erasing units storing valid data according to a programming sequence of the physical erasing units storing valid data among the physical erasing units. The memory control circuit further records an erase count for each of the physical erasing units and selects a first physical erasing unit from the physical erasing units storing valid data according to the timestamps the physical erasing units. The memory control circuit unit further gets a second physical erasing unit from the physical erasing units not storing valid data according to the erase count of each of the physical erasing units. Also, the memory control circuit sends a first command sequence instructing to write the valid data in the first physical erasing unit into the second physical erasing unit, and the memory control circuit unit marks the first physical erasing unit as a physical erasing unit not storing valid data.

Based on above, the physical erasing units storing data that are not modified for a long time and the physical erasing unit having a greater erase count are selected according to the timestamps and the erase counts, and the selected physical erasing units are used to perform wear leveling process. Accordingly, the erase counts for the physical erasing units may be effectively made even, so as to prolong the lifetime of the memory storage device.

In order to make the aforementioned and other features and advantages of the invention comprehensible, several exemplary embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF THE EMBODIMENTS

Figure 1:
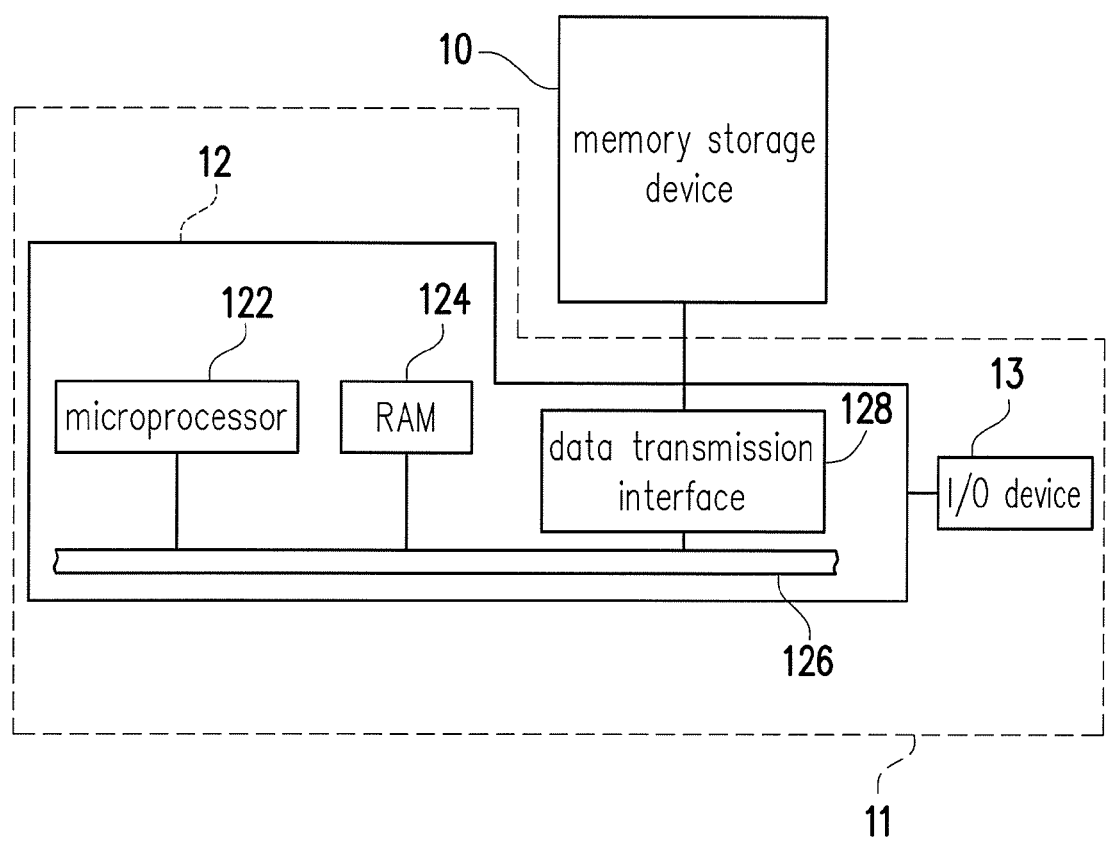
FIG. 1 is a schematic view illustrating a host system and a memory storage device according to a first exemplary embodiment.

Reference will now be made in detail to the present preferred embodiments of the present invention, examples of which are illustrated in the accompanying drawings. Wherever possible, the same reference numbers are used in the drawings and the description to refer to the same or like parts.

Embodiments of the present invention may include any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally speaking, a memory storage device (i.e., a memory storage system) includes a rewritable non-volatile memory module and a controller (i.e., a control circuit). The memory storage device is usually used together with a host system, such that the host system can write data into or read data from the memory storage device.

Figure 2:
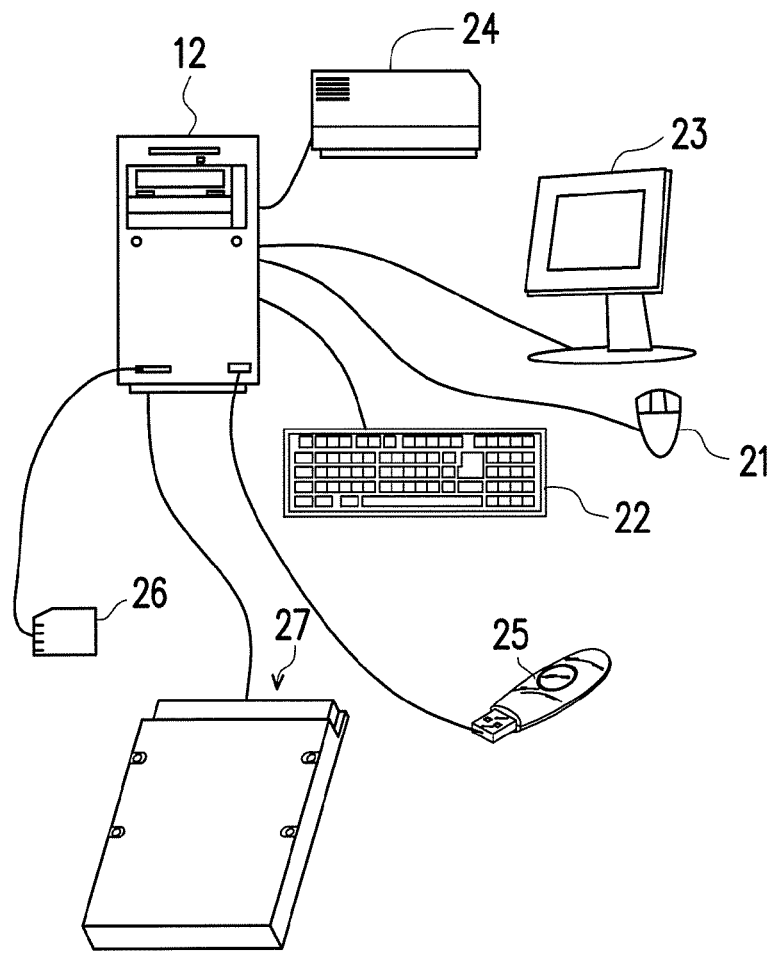
FIG. 2 is a schematic view illustrating a computer, an input/output device, and a memory storage device according to the first exemplary embodiment.

FIG. 1 is a schematic view illustrating a host system and a memory storage device according to a first exemplary embodiment, and FIG. 2 is a schematic view illustrating a computer, an input/output device, and a memory storage device according to the first exemplary embodiment.

Referring to FIG. 1, a host system 11 includes a computer 12 and an input/output (I/O) device 1106. The computer 12 includes a microprocessor 122, a random access memory (RAM) 124, a system bus 126, and a data transmission interface 128. The I/O device 13 includes a mouse 21, a keyboard 22, a display 23 and a printer 24 as shown in FIG. 2. It should be understood that the devices illustrated in FIG. 2 are not intended to limit the I/O device 13, and the I/O device 13 may further include other devices.

In this embodiment, the memory storage device 100 is electrically connected with other components of the host system 11 through a data transmission interface 128. By using the microprocessor 122, the random access memory (RAM) 124 and the I/O device 13, the data are written into or read from the memory storage device 10. For instance, the memory storage device 10 may be a rewritable non-volatile memory storage device, such as a flash drive 25, a memory card 26, or a solid state drive (SSD) 27, as shown in FIG. 2.

Figure 3:
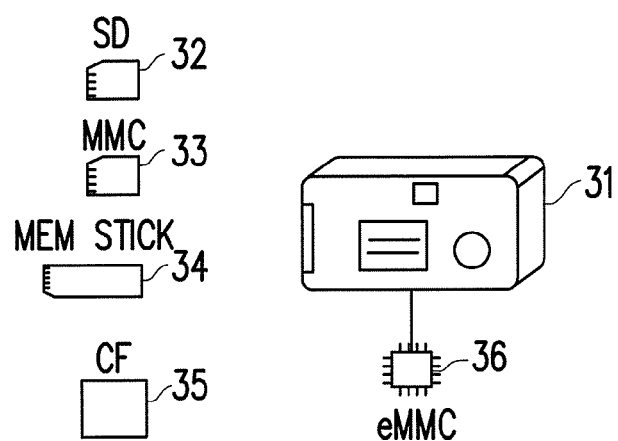
FIG. 3 is a schematic view illustrating a host system and a memory storage device according to a first exemplary embodiment.

FIG. 3 is a schematic view illustrating a host system and a memory storage device according to a first exemplary embodiment.

Generally speaking, the host system 11 may be any system substantially collocated with the memory storage device 10 for data storage. Even though the host system 11 is described as a computer system in this embodiment, the host system 11 may be a system such as a digital camera, a video camera, a telecommunication device, an audio player, or a video player in another embodiment. For example, if the host system is a digital camera (video camera) 31 in FIG. 3, the rewritable non-volatile memory storage device is then a secure digital (SD) card 32, a multimedia card (MMC) 33, a memory stick 34, a compact flash (CF) card 35 or an embedded storage device 36 (as shown in FIG. 3). The embedded storage device 36 includes an embedded MMC (eMMC). It is worth mentioning that the eMMC is directly electrically connected to a substrate of the host system.

Figure 4:
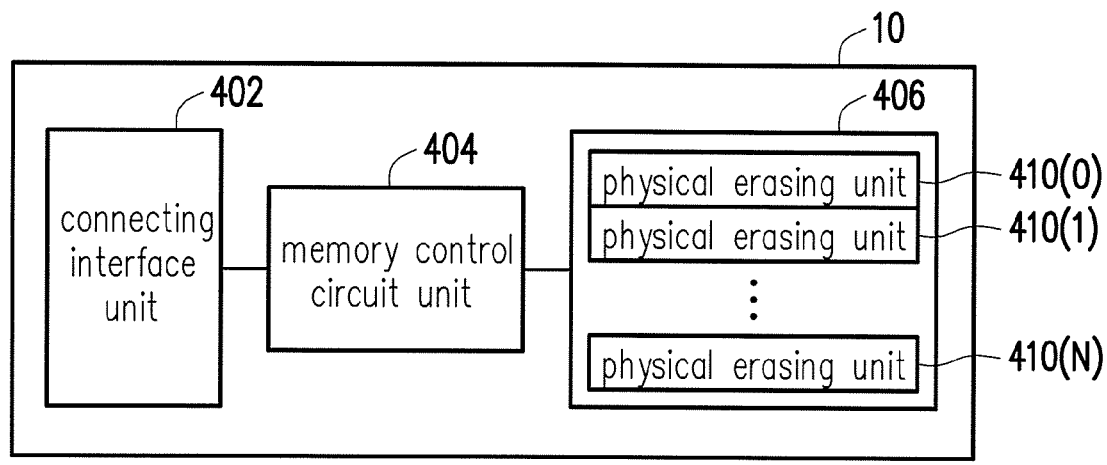
FIG. 4 is a schematic block view illustrating a memory storage device according to the first exemplary embodiment.

FIG. 4 is a schematic block view illustrating a memory storage device according to the first exemplary embodiment.

Referring to FIG. 4, the memory storage device 10 includes a connecting interface unit 402, a memory control circuit unit 404, and a rewritable non-volatile memory module 406.

In this embodiment, the connecting interface unit 402 is compatible with the serial advanced technology attachment (SATA) standard. However, it should be understood that the invention is not limited thereto. The connecting interface unit 402 may also be compatible with the parallel advanced technology attachment (PATA) standard, the Institute of Electrical and Electronic Engineers (IEEE) 1394 standard, the peripheral component interconnect express (PCI Express) standard, the universal serial bus (USB) standard, the ultra high speed-I (UHS-I) interface standard, the ultra high speed-II (UHS-II) interface standard, the secure digital (SD) interface standard, the memory stick (MS) interface standard, the multimedia card (MMC) interface standard, the compact flash (CF) interface standard, the integrated device electronics (IDE) standard, or other suitable standards. In this embodiment, the connecting interface unit may be packaged with the memory control circuit unit in one chip, or may be disposed outside the chip including the memory control circuit unit.

The memory control circuit unit 404 is configured for executing a plurality of logic gates or control commands implemented in a hardware form or in a firmware form, and performing various data operations, such as data writing, data reading or data erasing in the rewritable non-volatile memory module 406 according to the commands sent by the host system 11.

The rewritable non-volatile memory module 406 is coupled to the memory control circuit unit 404 and configured for storing data written by the host system 11. The rewritable non-volatile memory module 406 includes physical erasing units 410(0)~410(N). For example, the physical erasing units 410(0)~410(N) may belong to the same die or different dies of the memory. Each of the physical erasing units has a plurality of physical programming units. In addition, the physical programming units of the same physical erasing unit may be written individually but erased simultaneously. However, it should be understood that the present invention is not limited thereto. Each of the physical erasing units may be formed of 64 physical programming units, 256 physical programming units, or other arbitrary numbers of physical programming units.

To be more specific, the physical erasing unit is the minimum unit for erasing. In other words, each of the physical erasing units has the minimum number of memory cells that are erased together. The physical programming unit is the minimum unit for programming. In other words, the physical programming unit is the minimum unit for writing data. Normally, each of the physical programming units includes a data bit area and a redundant bit area. The data bit area includes a plurality of physical access addresses for storing the user's data, while the redundant bit area stores system data (e.g., control information and error correction code). In this embodiment, the data bit area of each of the physical programming units includes eight physical access addresses, and the size of one physical access address is 512 bytes. However, in other embodiments, the data bit area may also include more or fewer physical access addresses, and the present invention does not intend to limit the size and number of the physical access addresses. For example, in an embodiment, the physical erasing unit is a physical block, and the physical programming unit is a physical page or a physical sector. However, the present invention is not limited thereto.

In this embodiment, the rewritable non-volatile memory module 406 is a multi-level cell (MLC) NAND flash memory module (i.e., a flash memory module where one memory cell stores two data bits). However, the invention is not limited thereto. The rewritable non-volatile memory module 406 may also be a single-level cell (SLC) NAND flash memory module (i.e., a flash memory module where one memory cell stores one data bit), a trinary-level cell (TLC) NAND flash memory module (i.e., a flash memory module where one memory cell stores three data bits), other flash memory modules, or other memory modules having the same properties.

Figure 5:
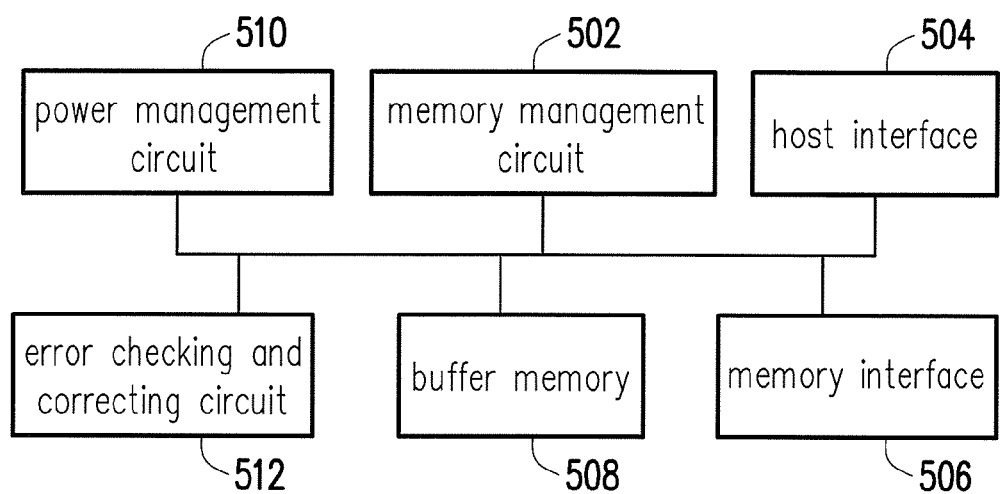
FIG. 5 is a schematic block view illustrating a memory control circuit unit according to the first exemplary embodiment.

FIG. 5 is a schematic block view illustrating a memory control circuit unit according to the first exemplary embodiment.

Referring to FIG. 5, the memory control circuit unit 404 includes a memory management circuit 502, a host interface 504, and a memory interface 506.

The memory management circuit 502 is configured to control the overall operation of the memory control circuit unit 404. Specifically, the memory management circuit 502 has a plurality of control commands. When the memory storage device 10 is operated, the control commands are executed to perform various data operations such as data writing, data reading and data erasing.

In this embodiment, the control instructions of the memory management circuit 502 are implemented in a firmware form. For instance, the memory management circuit 502 has a microprocessor (not shown) and a read-only memory (not shown), and the control instructions are burned into the read-only memory. When the memory storage device 10 is operated, the control instructions are executed by the microprocessor unit for various data operations, such as data writing, data reading or data erasing.

According to another embodiment of the invention, the control instructions of the memory management circuit 502 may also be stored in a specific area (for example, the system area in the memory module exclusively used for storing system data) of the rewritable non-volatile memory module 406 as program codes. Moreover, the memory management circuit 502 has a microprocessor unit (not shown), a read-only memory (not shown), and a random access memory (not shown). Specifically, the read-only memory has a boot code. When the memory control circuit unit 404 is enabled, the boot code is firstly executed by the microprocessor unit for loading the control instructions stored in the rewritable non-volatile memory module 406 into the random access memory of the memory management circuit 502. Afterwards, the microprocessor unit executes the control instructions for various data operation such as data writing, data reading and data erasing.

The host interface 504 is coupled to the memory management circuit 502 and to the connecting interface unit 402, so as to receive and identify the commands and data sent by the host system 11. Namely, the commands and data transmitted by the host system 11 are transmitted to the memory management circuit 502 through the host interface 504. In this embodiment, the host interface 504 is compatible with the SATA standard. However, it should be understood that the invention is not limited thereto. The host system 504 may also be compatible with the PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable data transmission standards.

The memory interface 506 is coupled to the memory management circuit 502 and configured for accessing the rewritable non-volatile memory module 406. In other words, data to be written into the rewritable non-volatile memory module 406 are converted into a format acceptable for the rewritable non-volatile memory module 406.

In an embodiment, the memory control circuit unit 404 further includes a buffer memory 508, a power management circuit 510, and an error checking and correcting circuit 512.

The buffer memory 508 is coupled to the memory management circuit 502 and configured for temporarily storing data and commands from the host system 11 or data from the rewritable non-volatile memory module 406.

The power management circuit 510 is coupled to the memory management circuit 502 and configured for controlling the power of the of the memory storage device 10.

The error checking and correcting (ECC) circuit 512 is coupled to the memory management circuit 502 and configured for performing an error correcting process to ensure the accuracy of data. More specifically, when the memory management circuit 502 receives a write command from the host system 11, the error checking and correcting circuit 512 generates a corresponding error checking and correcting (ECC) code corresponding to the write command. In addition, the memory management circuit 502 may write the data corresponding to the write command and the corresponding ECC code to the rewritable non-volatile memory module 406. Subsequently, when the memory management circuit 502 reads the data from the rewritable non-volatile memory module 406, the ECC code corresponding to the data is also read, and the ECC circuit 512 performs the error checking and correcting process for the read data based on the ECC code.

Figure 6A:
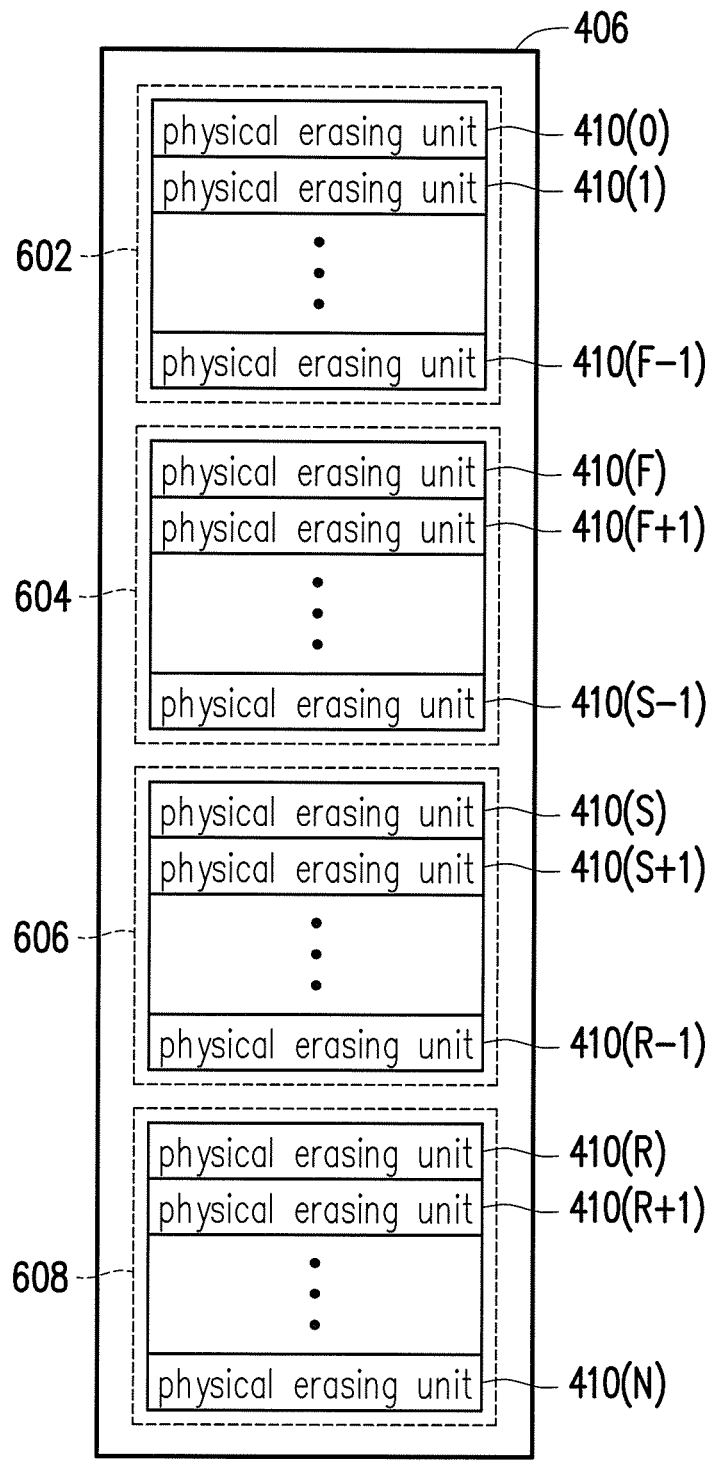
FIGS. 6A and 6B are schematic views illustrating managing physical erasing units according to the first exemplary embodiment.
Figure 6B:
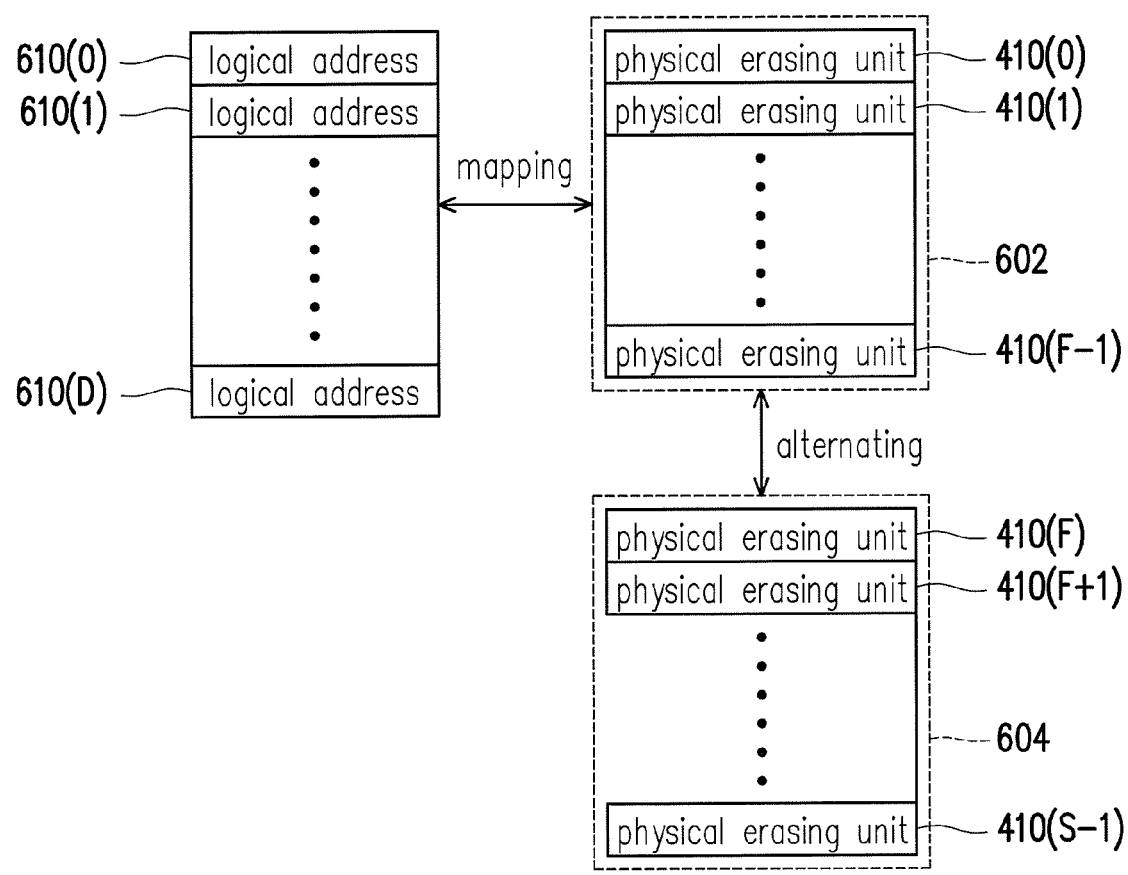

FIGS. 6A and 6B are schematic views illustrating managing physical erasing units according to the first exemplary embodiment.

It should be understood that, when the operations of the physical erasing units of the rewritable non-volatile memory module 106 are described in the following, terms such as "getting", "grouping", "dividing", and "associating" that are used to indicate that the operations of the physical erasing units refer to logical concepts. In other words, the physical positions of the physical erasing units of the non-volatile memory module are not changed. Instead, the operations are performed logically to the physical erasing units of the rewritable non-volatile memory module.

Referring to FIG. 6A, the memory control circuit unit 404 (or the memory management circuit 502) may logically group the physical erasing units 410(0)~410(N) into a data area 602, a spare area 604, a system area 606, and a replacement area 608.

The physical erasing units logically belonging to the data area 602 and the spare area 604 are configured for storing data from the host system 11. Specifically, the physical erasing units of the data area 602 are considered as physical erasing units already storing data, while the physical erasing units in the spare area 604 serve to replace the physical erasing units in the data area 602. In other words, when the host system 11 receives the write command and the data to be written, the memory management circuit 502 may get a physical erasing unit from the spare area 604 and write the data to the gotten physical erasing unit, so as to replace the physical erasing units in the data area 602. Normally, the physical erasing units in the data area 602 store valid data after the user's operation, and the physical erasing units in the spare area 604 are physical erasing units that do not store valid data.

The physical erasing units logically belonging to the system area 606 are configured to record system data. For example, the system data include the manufacturer and model number of the rewritable non-volatile memory module, the number of physical erasing units of the rewritable non-volatile memory module, and the number of physical programming units of each of the physical erasing units.

The physical erasing units in the replacement area 608 are used in a bad physical erasing unit replacement process, so as to replace damaged physical erasing units. Specifically, if there are still normal physical erasing units in the replacement area 608 and there is a damaged physical erasing unit in the data area 602, the memory management circuit 502 may get a normal physical erasing unit from the replacement area 608 to replace the damaged physical erasing unit.

In particular, the numbers of the physical erasing units in the data area 602, the spare area 604, the system area 606, and the replacement area 608 may differ as the specification of the memory differs. Besides, it should be understood that, in the operation of the memory storage device 10, grouping of the physical erasing units in association with the data area 602, the spare area 604, the system area 606, and the replacement area 608 may change dynamically. For example, when the physical erasing units in the spare area 604 are damaged and replaced by the physical erasing units of the replacement area 608, the physical erasing units originally in the replacement area 608 are associated to the spare area 604.

Referring to FIG. 6B, the physical erasing units in the data area 602 and the spare area 604 store data written by the host system 11 in an alternate manner. In this exemplary embodiment, the memory control circuit unit 404 (or the memory management circuit 502) may configure logical addresses 610(0)~610(D) to the host system 11 to map to a portion of the physical erasing units 410(0)~410(F−1) in the data area 602, so as to access data stored in the physical erasing units in the alternate manner. In particular, the host system 11 may access the data in the data area 602 through the logical addresses 610(0)~610(D). Besides, the memory control circuit unit 404 (or the memory management circuit 502) may set up a logical-physical mapping table to record a mapping relation between the logical addresses and the physical erasing units. The logical-physical mapping table may further record various logical-to-physical corresponding relations such as mapping relations between logical addresses and physical programming units, logical programming units and physical programming units, and/or logical programming units and physical erasing units, and the present invention does not intend to impose a limitation in this respect.

Referring to FIG. 6A again, in this embodiment, the memory control circuit unit 404 (or the memory management circuit 502) may record timestamps for the physical erasing units 410(0)~410(F−1) of the data area 602 according to a programming sequence of the physical erasing units 410(0)~410(F−1) of the data area 602. Here, the programming sequence refers to a sequence by which data are written to the physical erasing units 410(0)~410(F−1) of the data area 602. For example, the programming sequence of each of the physical erasing units 410(0)~410(F−1) in the data area 602 represents how new/old the data in each of the physical erasing units 410(0)~410(F−1) is. In other words, data written to a physical erasing unit earlier are older data, and data written to a physical erasing unit later are newer data.

In this embodiment, the memory controlling circuit unit 404 (or the memory management circuit 502) records a corresponding erase count for each of the physical erasing units 410(0)~410(N). To be more specific, the erase counts of the physical erasing units 410(0)~410(N) is limited. For example, a physical erasing unit may be damaged after ten thousand times of erasing. Also, when the physical erasing units are worn out, resulting in loss of a portion of the storage capacity or significant degeneration in performance, the data stored by the user may be lost, or data may not be stored. In particular, a wear level of the physical erasing unit is determined by the number of times that each of the physical erasing units is programmed or erased. In other words, if a physical erasing unit is merely programmed (or written) once, and is not further programmed thereafter, the wear level of the physical erasing unit is relatively low. On the contrary, if a physical erasing unit is repetitively programmed and erased, the wear level of the physical erasing unit is relatively high. For example, when one of the physical erasing units of the rewritable non-volatile memory module 406 is erased, the memory control circuit unit 404 (or the memory management circuit 502) may add 1 to the erase count corresponding to the physical erasing unit. Here, the erase count may be recorded in a table of erase counts or in the corresponding physical erasing unit.

In this embodiment, when a wear leveling operation is performed, the memory control circuit unit 404 (or the memory management circuit 502) may choose the physical erasing units in the spare area 604 and the data area 602 for switching according to the wear level (i.e., erase count) and the recorded timestamp for each of the physical erasing units 410(0) to 410(N). For example, the memory control circuit unit 404 (or the memory management circuit 502) may choose a physical erasing unit (i.e., first physical erasing unit) from the physical erasing units 410(0)~410(F−1) of the data area 602 according to the timestamps, and get another physical erasing unit (i.e., second physical erasing unit) from the spare area 604 according to the erase count recorded for each of the physical erasing units. Then, the memory control circuit unit 404 (or the memory management circuit 502) may send a command sequence (i.e., first command sequence). Herein, the first command sequence includes one or more commands or program codes, and instructs to write valid data in the first physical erasing unit into the second physical erasing unit and label the first physical erasing unit as a physical erasing unit that does not store valid data. In other words, the memory control circuit unit 404 (or the memory management circuit 502) may associate the second physical erasing unit with the data area 602, and associate the first physical erasing unit with the spare area 604, so as to complete the wear leveling process. In this embodiment, the memory control circuit unit 404 (or the memory management circuit 502) gets the physical erasing unit having the greatest erase count in the spare area 604 to perform the wear leveling process. In other words, the erase count of the second physical erasing unit is greater than the erase counts of other physical erasing units in the spare area 604. However, the present invention does not intend to limit the erase count of the gotten second physical erasing unit. For example, in another embodiment, the memory control circuit unit 404 (or the memory management circuit 502) performs the wear leveling process by getting the physical erasing unit with the second greatest erase count in the spare area 604.

For example, in this exemplary embodiment, the memory control circuit unit 404 (or the memory management circuit 502) may set up a queue to sequentially record the physical erasing units 410(0)~410(F−1) according to the programming sequence of the physical erasing units 410(0)~410(F−1) of the data area 602 to represent the timestamps of the physical erasing units of the data area 602.

Figure 7:
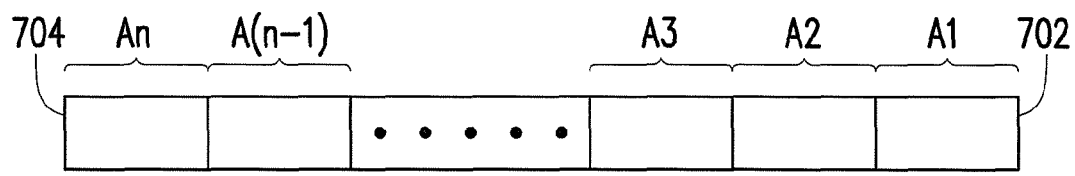
FIG. 7 is a schematic view illustrating a queue for recording timestamps corresponding to physical erasing units in a data area according to the first exemplary embodiment.

FIG. 7 is a schematic view illustrating a queue for recording timestamps corresponding to physical erasing units in a data area according to the first exemplary embodiment.

Referring to FIG. 7, in this embodiment, a queue 700 set up by the memory control circuit unit 404 (or the memory management circuit 502) has a first end 702, a second end 704, and a plurality of positions A1~An between the first end 702 and the second end 704. Here, the first end 702 is a head end of the queue 700, while the second end 704 is a trailing end of the queue 700. However, it should be understood that the present invention is not limited thereto. In another embodiment, the first end 702 may also be the trailing end of the queue 700, while the second end 704 may also be the head end of the queue 700. The queue 700 may be stored in the buffer memory 508 or the random access memory 124 in the form of table, and may be updated to the rewritable non-volatile memory module 406 before the host system 11 is turned off or the memory storage device 10 is powered off.

Figure 8A:
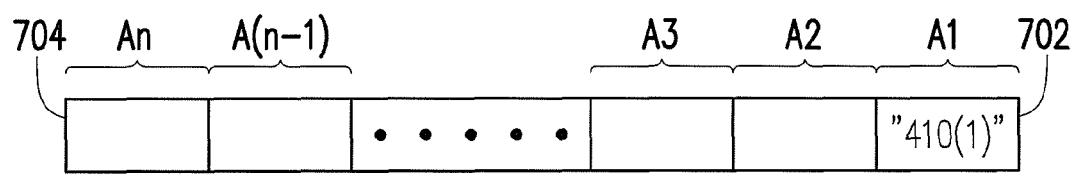
FIGS. 8A and 8B are schematic views illustrating allocating the timestamps for the physical erasing units in the data area according to the first exemplary embodiment.
Figure 8B:
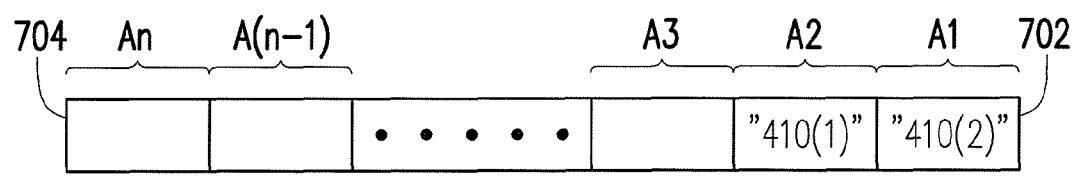

FIGS. 8A and 8B are schematic views illustrating allocating the timestamps for the physical erasing units in the data area according to the first exemplary embodiment.

Referring to FIG. 8A, if the memory control circuit unit 404 (or memory management circuit 502) receives an operation command sequence that intends to write data (i.e., first data) to the logical address 610(1) (i.e., first logical address) from the host system 11, the memory control circuit unit 404 (or the memory management circuit 502) may send a command sequence (i.e., second command sequence). Herein, the second command sequence includes one or more commands or program codes, and instructs to program the first data belonging to the first logical address 610(1) to a physical erasing unit (e.g., the physical erasing unit 410(1)). The memory control circuit unit 404 (or the memory management circuit 502) may map the physical erasing unit 410(1) to the first logical address 610(1) (i.e., associating the physical erasing unit 410(1) with the data area 602), and record the physical erasing unit 410(1) mapping to the first logical address 610(1) in a position A1 in the queue 700 from the first end 702 of the queue 700. It should be noted that the present invention does not intend to limit the format of recording the physical erasing units in the queue 700. For example, the memory control circuit unit 404 (or the memory management circuit 502) may record information representing the physical erasing unit 410(1) in the queue 700. For example, "410(1)" as shown in the queue 700 in FIG. 8A may be a number, identity value, or corresponding logical address of the physical erasing unit 410(1).

Referring to FIG. 8B, after the first data is programmed to the physical erasing unit 410(1) mapping to the first logical address 610(1), if the memory control circuit unit 404 (or the memory management circuit 502) receives an operation command sequence that intends to write data (i.e., second data) to the logical address 610(2) (i.e., second logical address) from the host system 11, the memory control circuit unit 404 (or the memory management circuit 502) may send a third command sequence. Herein, the third command sequence also includes one or more commands or program codes, and instructs to program the second data belonging to the second logical address 610(2) to a physical erasing unit (e.g., the physical erasing unit 410(2)), map the physical erasing unit 410(2) to the second logical address 610(2) (i.e., associating the physical erasing unit 410(2) with the data area 602), and record the physical erasing unit 410(2) mapping to the second logical address 610(2) to the queue 700. Similarly, "410(2)" in the queue 700 shown in FIG. 8B may be a number, identity value, or corresponding logical address of the physical erasing unit 410(2).

At this time, as shown in FIG. 8B, a position A2 that records the physical erasing unit 410(1) mapping to the first logical address 610(1) in the queue 700 follows the position A1 that records the physical erasing unit 410(2) mapping to the second logical address 610(2). In other words, a distance between the position A2 that records the physical erasing unit 410(1) mapping to the first logical address 610(1) and the first end 702 is longer than a distance between the position A1 that records the physical erasing unit 410(2) mapping to the second logical address 610(2) and the first end 702.

More specifically, for data that are hardly modified or even set as read-only (also referred to as "cold data" in the following) after being written to the rewritable non-volatile memory module 406, since the physical erasing unit storing such cold data is hardly or never updated, the erase count of such physical erasing unit is relatively lower. In this exemplary embodiment, the memory control circuit unit 404 (or the memory management circuit 502) records the physical erasing units that are sequentially programmed from the first end 702 of the queue 700. In other words, the data in a physical erasing unit recorded at a position having a shorter distance to the second end 704 and a greater distance to the first end 702 in the queue 700 are older and modified less frequently. Thus, the possibility that the data that are older and modified less frequently are cold data is higher. Therefore, in the operation of choosing the first physical erasing unit from the physical erasing units in the data area 602 according to the timestamps, the memory control circuit unit 404 (or the memory management circuit 502) may choose one of the physical erasing units according to the sequence from the second end 704 of the queue 700.

Figure 9:
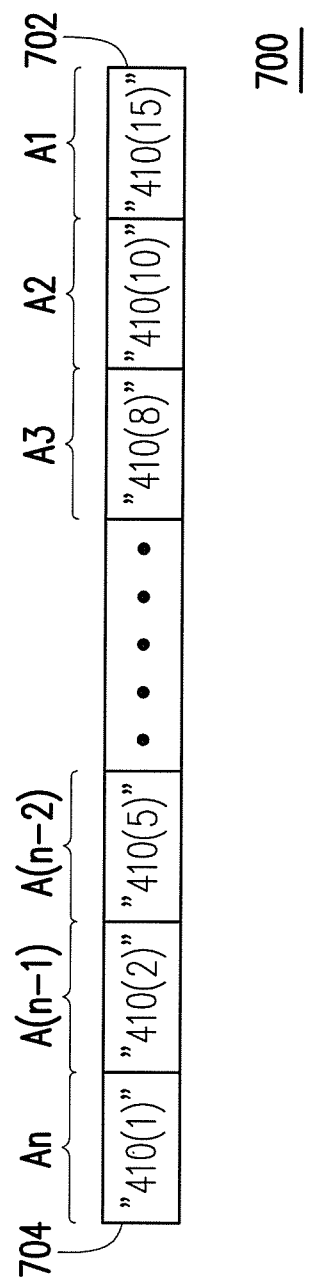
FIG. 9 is a schematic view illustrating selecting the physical erasing unit according to the timestamps according to the first exemplary embodiment.

FIG. 9 is a schematic view illustrating selecting the physical erasing unit according to the timestamps according to the first exemplary embodiment.

Referring to FIG. 9, in this exemplary embodiment, it is assumed that the memory control circuit unit 404 (or the memory management circuit 502) already records information of the physical erasing units that are sequentially programmed according to the programming sequence of the physical erasing units in the positions A1~An in the queue 700. Therefore, in the operation of selecting the first physical erasing unit from the physical erasing units 410(0)~410(F−1) in the data area 602 according to the timestamps, the memory control circuit unit 404 (or the memory management circuit 502) may choose the physical erasing unit 410(1) recorded in the position An at the second end 704 in the queue 700. Then, the memory control circuit unit 404 (or the memory management circuit 502) may perform an operation of determining the erase count, so as to determine whether the erase count of the selected physical erasing unit is smaller than a value obtained by subtracting a predetermined value from an average of the erase counts of the physical erasing units. In this exemplary embodiment, the average of the erase counts of the physical erasing units is an average of the erase counts of all the physical erasing units in the rewritable non-volatile memory module 406, and the predetermined value is a positive integer greater than or equal to 0. However, the present invention is not limited thereto. For example, in another embodiment, the average of the erase counts of the physical erasing units may be an average of the erase counts of a portion of the physical erasing times, and the predetermined value may be adjusted and set according to a performance of execution of the memory storage device 10.

Then, if the erase count of the selected physical erasing unit is smaller than the value obtained by subtracting the predetermined value from the average of the erase counts of the physical erasing units, the memory control circuit unit 404 (or the memory management circuit 502) may use the selected physical erasing unit as the first physical erasing unit. Alternatively, if the erase count of the selected physical erasing unit is not smaller than the value obtained by subtracting the predetermined value from the average of the erase counts of the physical erasing units, the memory control circuit unit 404 (or memory management circuit 502) may select the next physical erasing unit from the second end 704 of the queue 700 based on the sequence and perform the operation of determining the erase count.

Referring to FIG. 9 again, taking the state shown in FIG. 9 as an example, the memory control circuit unit 404 (or the memory management circuit 502) may select the physical erasing unit 410(1) recorded at the position An from the second end 704 of the queue 700 and determine whether the erase count of the selected physical erasing unit 410(1) is smaller than the value obtained by subtracting the predetermined value from the average of the erase counts of the physical erasing units. Here, it is assumed that the erase count of the physical erasing unit 410(1) is determined by the memory control circuit unit 404 (or the memory management circuit 502) to be not smaller than the value obtained by subtracting the predetermined value from the average of the erase counts of the physical erasing units. Accordingly, the memory control circuit unit 404 (or the memory management circuit 502) may select the physical erasing unit 410(2) recorded at the position A(n−1) from the second end 704 of the queue 700 based on the sequence and perform the operation of determining the erase count.

The memory control circuit unit 404 (or the memory management circuit 502) subsequently determines whether the erase count of the selected physical erasing unit 410(2) is smaller than the value obtained by subtracting the predetermined value from the average of the erase counts of the physical erasing units. Here, if the erase count of the selected physical erasing unit 410(2) is smaller than the value obtained by subtracting the predetermined value from the average of the physical erasing counts for the physical erasing units, the memory control circuit unit 404 (or the memory management circuit 502) may use the selected physical erasing unit 410(2) as the first physical erasing unit.

Figure 10A:
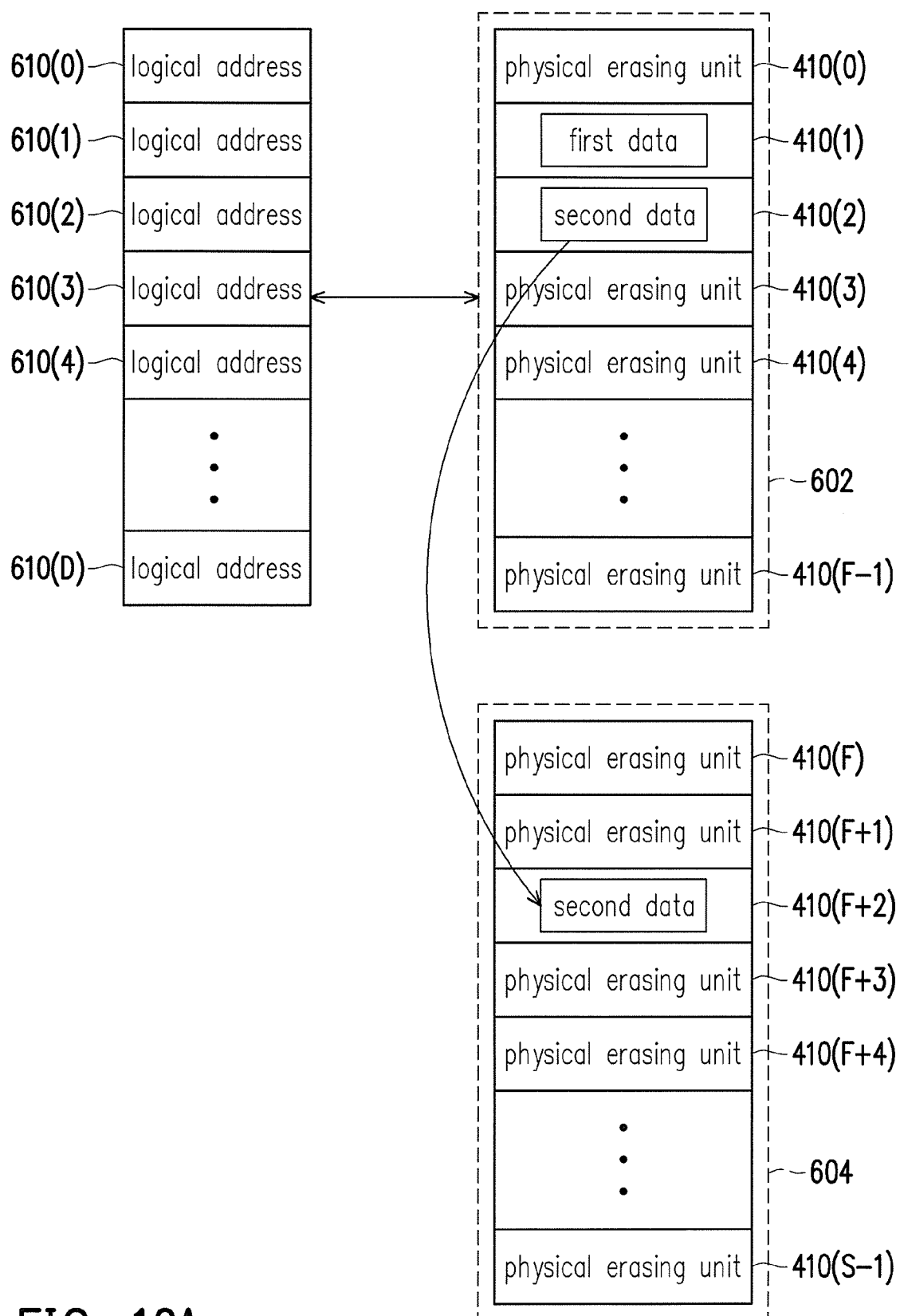
FIGS. 10A and 10B are schematic views illustrating performing a wear leveling operation according to the first exemplary embodiment.
Figure 10B:
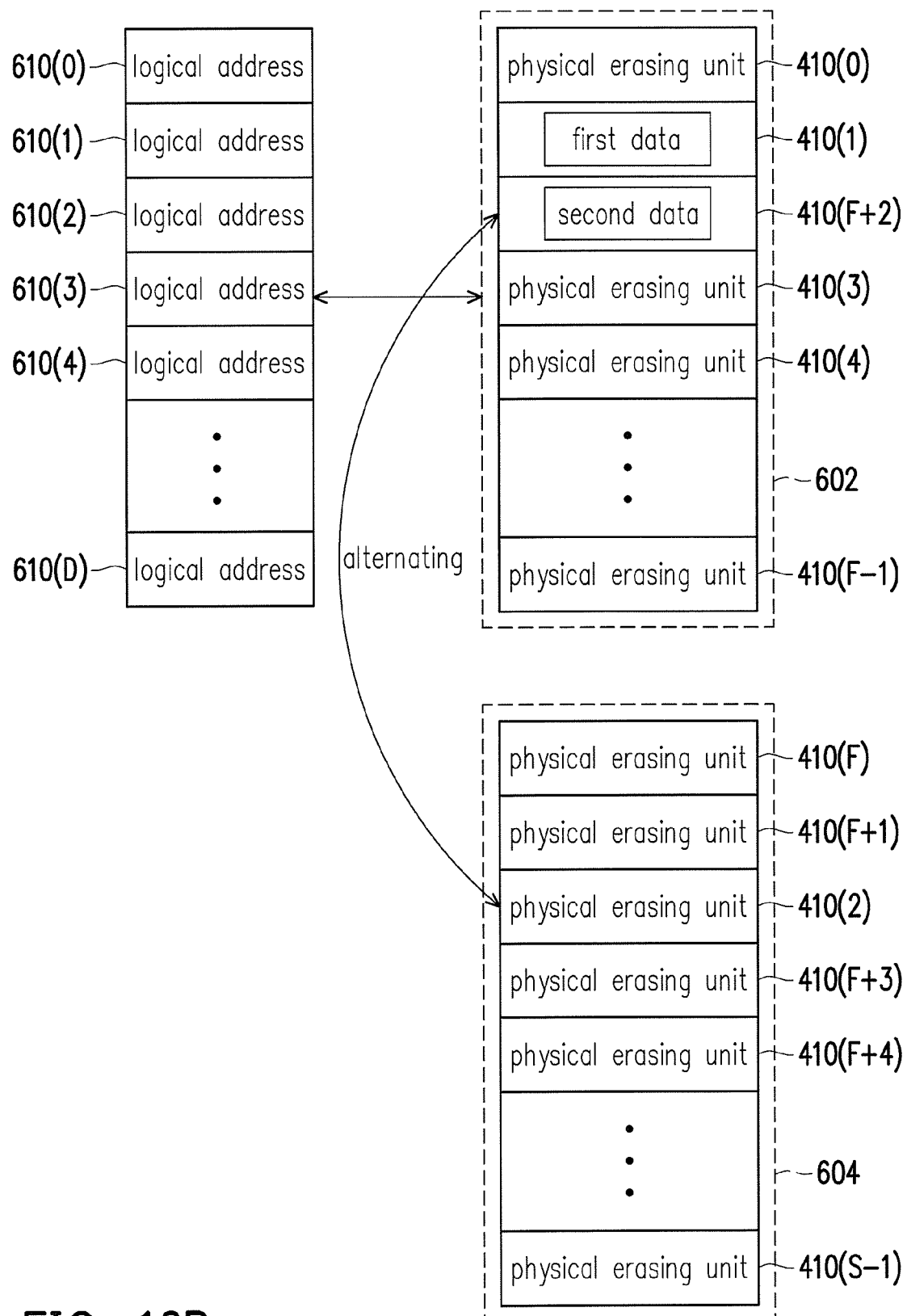

FIGS. 10A and 10B are schematic views illustrating performing a wear leveling operation according to the first exemplary embodiment.

Referring to FIGS. 10A and 10B, when performing the wear leveling operation, the memory control circuit unit 404 (or the memory management circuit 502) may select a physical erasing unit (e.g., the physical erasing unit 410(2)) from the data area 602 based on the timestamps and erase counts (such as the determining process in FIG. 9), select a physical erasing unit (e.g., the physical erasing unit 410(F+2)) with the greatest erase count from the spare area 604, and then copy the valid data in the physical erasing unit 410(2) to the physical erasing unit 410(F+2), associate the physical erasing unit 410(F+2) with the data area 602 (i.e., mapping to the physical erasing unit 410(F+2) to the logical address 610(2)), and associate the physical erasing unit 410(2) (or the physical erasing unit 410(2) after erasing) with the spare area 604. In this exemplary embodiment, by using the operation of selecting the physical erasing unit based on the timestamps and the operation of determining the erase count of the selected physical erasing unit, the physical erasing unit storing older and less frequently modified cold data may be selected, and the selected physical erasing unit has a smaller erase count. In this way, the probability that the wear leveling operation is performed to the physical erasing unit 410(F+2) again is lowered, and the probability to write data to the first physical erasing unit 410(2) originally storing cold data and having a smaller erase count is higher.

It is worth mentioning that the present invention does not intend to limit a time point of performing the wear leveling operation. For example, in this exemplary embodiment, the memory control circuit unit 404 (or the memory management circuit 502) performs the wear leveling operation when the erase count of a physical erasing unit is greater than a threshold, and the threshold may be determined based on the performance of execution and practical needs of the memory storage device 10. However, the present invention is not limited thereto. For example, in another embodiment, the memory control circuit unit 404 (or the memory management circuit 502) performs the wear leveling operation at a specific time interval.

Figure 11:
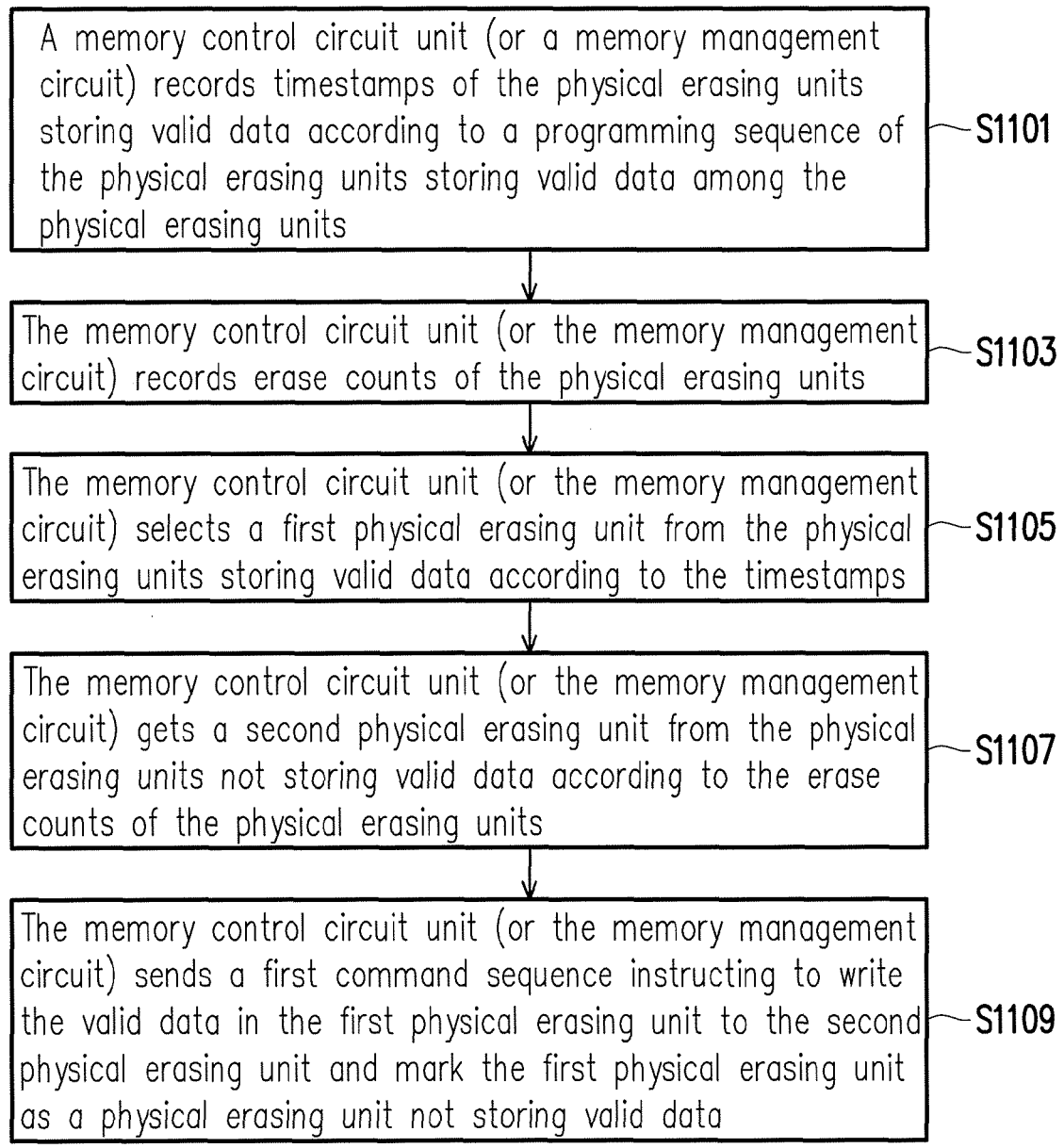
FIG. 11 is a flowchart illustrating a wear leveling method according to the first exemplary embodiment.

FIG. 11 is a flowchart illustrating a wear leveling method according to the first exemplary embodiment.

Referring to FIG. 11, at Step S1101, the memory control circuit unit 404 (or the memory management circuit 502) records the timestamps of the physical erasing units storing valid data based on the programming sequence of the physical erasing units 410(0)~410(F−1) that store valid data.

At Step S1103, the memory control circuit unit 404 (or the memory management circuit 502) records the erase counts of the physical erasing units.

At Step S1105, the memory control circuit unit 404 (or the memory management circuit 502) selects the first physical erasing unit from the physical erasing units that store valid data according to the timestamps.

At Step S1107, the memory control circuit unit 404 (or the memory management circuit 502) gets the second physical erasing unit from the physical erasing units that do not store valid data according to the erase counts of the physical erasing units.

At Step S1109, the memory control circuit unit 404 (or the memory management circuit 502) sends the first command sequence instructing to write the valid data in the first physical erasing unit to the second physical erasing unit, and marks the first physical erasing unit as a physical erasing unit that does not store valid data.

Second Exemplary Embodiment

The hardware structure of a memory storage device of the second exemplary embodiment is substantially identical to the hardware structure of the memory device of the first exemplary embodiment, but differs in that the memory storage device of the first exemplary embodiment arranges the timestamps for the physical erasing units of the data area as a queue, while the memory storage device of the second exemplary embodiment arranges the timestamps for the physical erasing units of the data area as a programming sequence table. In the following, the operation of the memory storage device of the second exemplary embodiment is described in detail with reference to the figures and reference numerals of the memory storage device of the first exemplary embodiment.

Figure 12A:
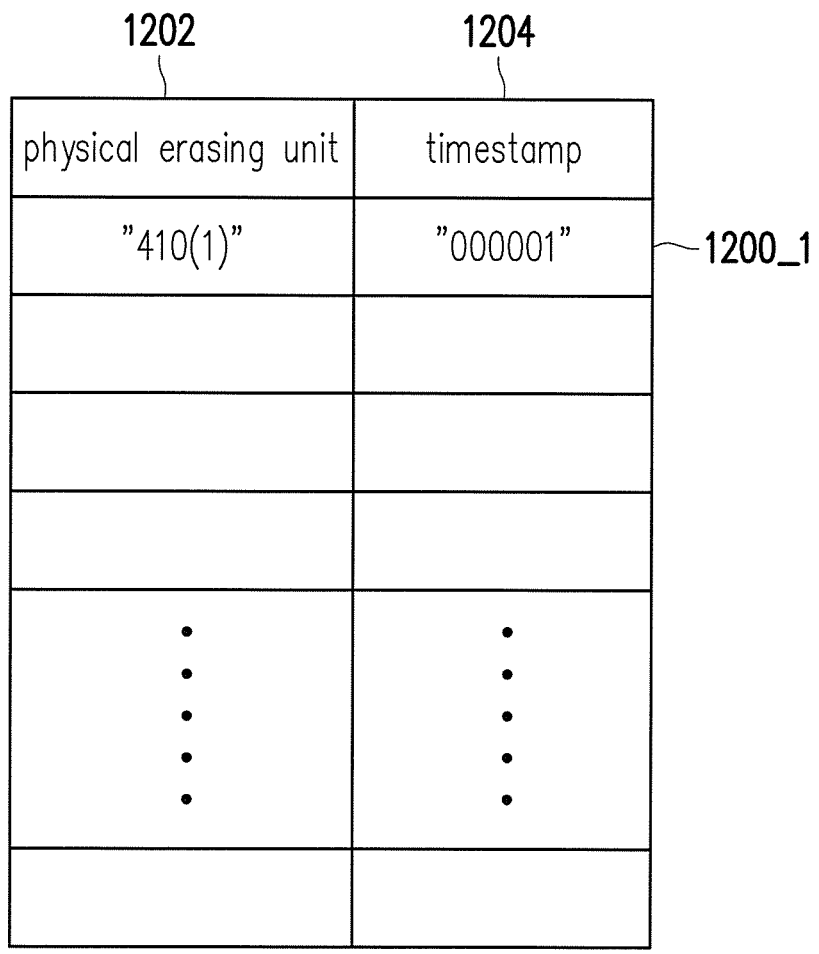
FIGS. 12A and 12B are schematic views illustrating allocating timestamps for physical erasing units in a data area according to a second exemplary embodiment.
Figure 12B:
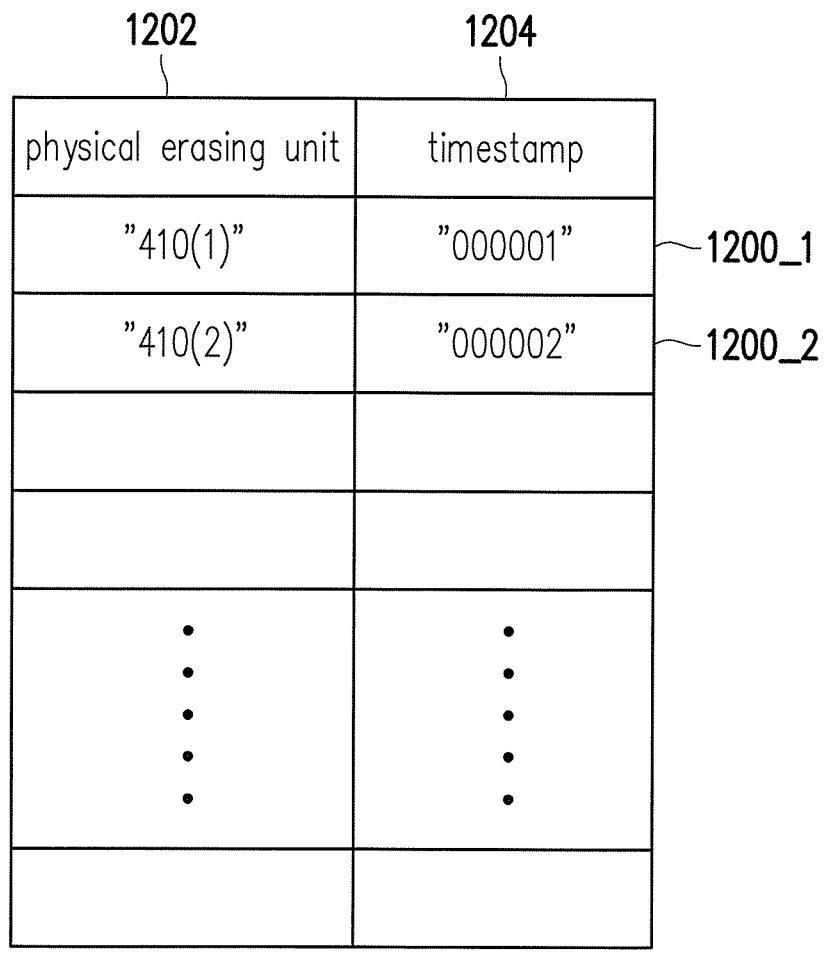

FIGS. 12A and 12B are schematic views illustrating allocating timestamps for physical erasing units in a data area according to a second exemplary embodiment.

Referring to FIG. 12A, the memory control circuit unit 404 (or the memory management circuit 502) may set up a programming sequence table 1200. For example, the programming sequence table 1200 includes a physical erasing unit column 1202 and a timestamp column 1204. The physical erasing unit column 1202 records the number, identity value, and corresponding logical address of the physical erasing unit that is programmed, while the timestamp column 1204 records the timestamp corresponding to the physical erasing unit.

If the memory control circuit unit 404 (or the memory management circuit 502) receives an operation command sequence that intends to write data (i.e., first data) to the logical address 610(1) (i.e., first logical address) from the host system 11, the memory control circuit unit 404 (or the memory management circuit 502) may send the second command sequence. The second command sequence includes one or more commands or program codes and instructs to program the first data belonging to the first logical address 610(1) to a physical erasing unit (e.g., the physical erasing unit 410(1)). The memory control circuit unit 404 (or the memory management circuit 502) may map the physical erasing unit 410(1) to the logical address 610(1), and record a timestamp for the physical erasing unit 410(1) correspondingly mapping to the first logical address 610(1) as a first timestamp 1200_1 in the programming sequence table 1200. For example, the memory control circuit unit 404 (or the memory management circuit 502) records the physical erasing unit 410(1) correspondingly mapping to the first logical address 610(1) as "410(1)", and records the first timestamp 1200_1 as "000001". For example, "410(1)" in the programming sequence table 1200 in FIG. 12A may be the number, identity value, or corresponding logical address of the physical erasing unit 410(1).

Referring to FIG. 12B, after programming the first data to the physical erasing unit 410(1), if the memory control circuit unit 404 (or the memory management circuit 502) receives an operation command sequence that intends to write data (i.e., second data) to the logical address 610(2) (i.e., second logical address) from the host system 11, the memory control circuit unit 404 (or the memory management circuit 502) may send the third command sequence. Herein, the third command sequence also includes one or more commands or program codes and instructs to program the second data belonging to the second logical address 610(2) to a physical erasing unit (e.g., the physical erasing unit 410(2)), map the physical erasing unit 410(2) to the second logical address 610(2), record the physical erasing unit 410(2) correspondingly mapping to the second logical address 610(2) as "410(2)" in the programming sequence table 1200, and record a second timestamp 1200_2 of the physical erasing unit 410(2) correspondingly mapping to the second logical address 610(2) as "000002". Similarly, "410 (2)" in the programming sequence table 1200 shown in FIG. 12B may be the number, identity value, or corresponding logical address of the physical erasing unit 410(2). Here, as shown in FIG. 12B, since the time that the physical erasing unit 410(1) mapping to the first logical address 610(1) and corresponding to the first timestamp 1200_1 is programmed is earlier than the time that the physical erasing unit 410(2) mapping to the second logical address 610(2) and corresponding to the second timestamp 12002 is programmed, the timestamp 1200_1 recorded by the memory control circuit unit 404 (or the memory management circuit 502) is smaller than the timestamp 1200_2.

Afterwards, when performing the wear leveling operation, the memory control circuit unit 404 (or the memory management circuit 502) may choose the physical erasing unit corresponding to the smallest timestamp according to the timestamps recorded in the programming sequence table 1200. For example, in the state shown in FIG. 12B, the memory control circuit unit 404 (or the memory management circuit 502) may select the physical erasing unit 410(1) corresponding to the smallest timestamp 1200_1 (i.e., the physical erasing unit 410(1) whose timestamp is recorded as "000001"), and determines whether the erase count of the selected physical erasing unit 410(1) is smaller than the value obtained by subtracting the predetermined value from the average of the erase counts of the physical erasing units. Here, it is assumed that the erase count of the physical erasing unit 410(1) is determined by the memory control circuit unit 404 (or memory management circuit 502) to be not smaller than the value obtained by subtracting the predetermined value from the average of the erase counts of the physical erasing units. Accordingly, the memory control circuit unit 404 (or the memory management circuit 502) may select the physical erasing unit 410(2) corresponding to the next timestamp according to the timestamps recorded in the programming sequence table 1200 and perform the operation of determining the erase count.

The memory control circuit unit 404 (or the memory management circuit 502) subsequently determines whether the erase count of the selected physical erasing unit 410(2) is smaller than the value obtained by subtracting the predetermined value from the average of the erase counts of the physical erasing units. Here, if the erase count of the selected physical erasing unit 410(2) is smaller than the value obtained by subtracting the predetermined value from the average of the physical erasing counts for the physical erasing units, the memory control circuit unit 404 (or the memory management circuit 502) may use the selected physical erasing unit 410(2) as the first physical erasing unit. Similarly, after the memory control circuit unit 404 (or the memory management circuit 502) selects the first physical erasing unit according to the timestamps and the erase counts and select the second physical erasing unit with the greatest erase count according to the erase counts of the physical erasing units, the memory control circuit unit 404 (or the memory management circuit 502) may perform the wear leveling operation to write the data of the first physical erasing unit to the second physical erasing unit, associate the second physical erasing unit with the data area 602, and associate the first physical erasing unit with the spare area 604. Here, the wear leveling operation is the same as the wear leveling operation described in FIGS. 10A and 10B of the first exemplary embodiment, and thus not repeated in the following.

Third Exemplary Embodiment

The hardware structure of a memory storage device of the third exemplary embodiment is substantially the same as the hardware structure of the memory storage device of the first exemplary embodiment, but differs in that the memory storage device of the third exemplary embodiment uses the redundant bit area of the physical erasing unit to record the timestamp for each of the physical erasing units in the data area. In the following, the operation of the memory storage device of the third exemplary embodiment is described in detail with reference to the figures and reference numerals of the memory storage device of the first exemplary embodiment.

Figure 13A:
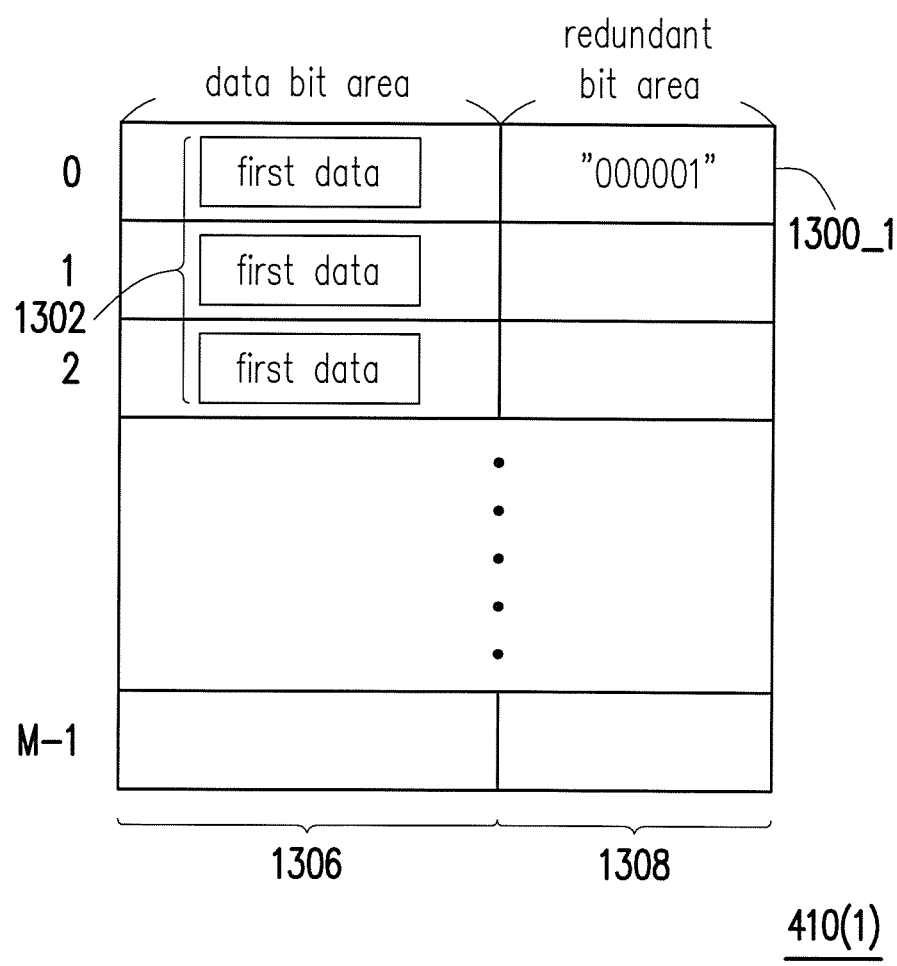
FIGS. 13A and 13B are schematic views illustrating allocating timestamps for physical erasing units in a data area according to a third exemplary embodiment.
Figure 13B:
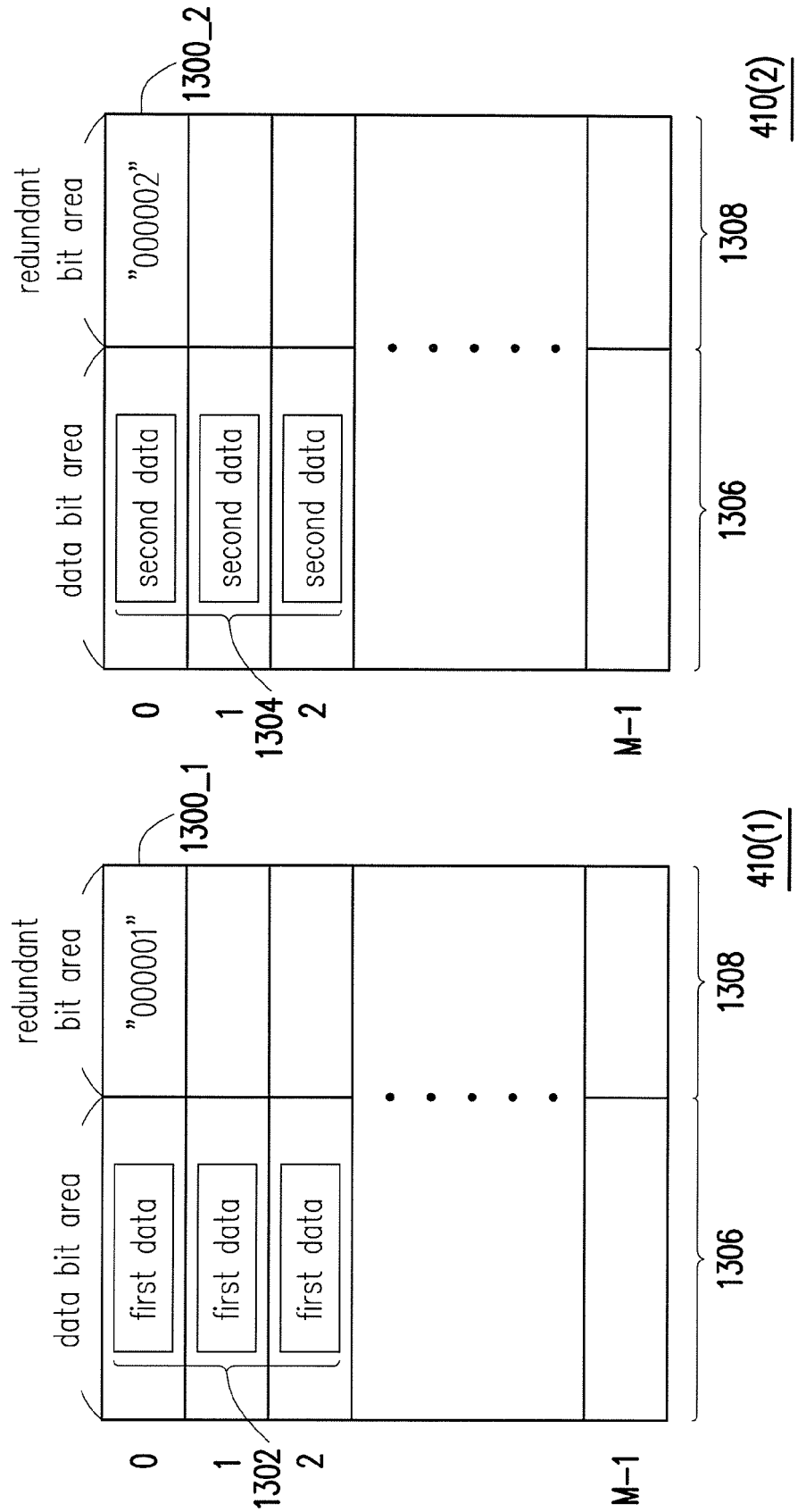

FIGS. 13A and 13B are schematic views illustrating allocating timestamps for physical erasing units in a data area according to a third exemplary embodiment.

Referring to FIG. 13A, each of the physical erasing units includes a plurality of physical programming units, and each of the programming units includes a data bit area and a redundant bit area. Taking the physical erasing unit 410(1) as an example, the physical erasing unit 410(1) includes a plurality of physical programming units (i.e., the $0^{th}$ physical programming unit to the M–$1^{th}$ physical programming unit) and each of the physical programming units includes a data bit area 1306 and a redundant bit area 1308.

In this embodiment, if an operation command sequence that intends to write data 1302 (i.e., first data) to the logical address 610(1) (i.e., the first logical address), the memory control circuit unit 404 (or the memory management circuit 502) may send the second command sequence. Herein, the second command sequence includes one or more commands or program codes, and instructs to program the first data 1302 belonging to the first logical address 610(1) to a physical erasing unit (e.g., the physical erasing unit 410(1)), and the memory control circuit unit 404 (or the memory management circuit 502) may simultaneously record a timestamp as a first timestamp 1300_1 in the redundant bit area 1308 of the physical erasing unit 410(1) and map the physical erasing unit 410(1) to the first logical address 610(1). For example, the memory control circuit unit 404 (or the memory management circuit 502) records the first time stamp 1300_1 with a value "000001" in the $0^{th}$ physical programming unit of the physical erasing unit 410(1). However, the present invention does not intend to limit the physical programming unit for recording the timestamp. For example, in another embodiment, the memory control circuit unit 404 (or the memory management circuit 502) uses another physical programming unit in the physical erasing unit 410(1) to record the first timestamp.

Referring to FIG. 13B, after the first data 1302 is programmed to the physical erasing unit 410(1), if the memory control circuit unit 404 (or the memory management circuit 502) receives an operation command sequence that intends to write data 1304 (i.e., second data) to the logical address 610(2) (i.e., the second logical address) from the host system 11, the memory control circuit unit 404 (or the memory management circuit 502) may send the third command sequence. Herein, the third command sequence includes one or more commands or program codes, and instructs to program the second data 1304 belonging to the second logical address 610(2) to a physical erasing unit (e.g., the physical erasing unit 410(2)), and the memory control circuit unit 404 (or the memory management circuit 502) may simultaneously record a second time stamp 1300_2 with a value "000002" in the $0^{th}$ physical programming unit of the physical erasing unit 410(2) and map the physical erasing unit 410(2) to the second logical address 610(2). Here, as shown in FIG. 13B, since the time that the physical erasing unit 410(1) mapping to the first logical, address 610(1) and corresponding to the first timestamp 1300_1 is programmed is earlier than the time that the physical erasing unit 410(2) mapping to the second logical address 610(2) and corresponding to the second timestamp 1300_2 is programmed, the timestamp 1300_1 recorded by the memory control circuit unit 404 (or the memory management circuit 502) is smaller than the timestamp 13002.

Afterwards, when performing the wear leveling operation, the memory control circuit unit 404 (or the memory management circuit 502) may select the physical erasing unit with the smallest timestamp according to a plurality of timestamps recorded in the redundant bit areas 1308 of the physical erasing units 410(0) to 410(F−1) in the data area 602. For example, in the state shown in FIG. 13B, the memory control circuit unit 404 (or the memory management circuit 502) may select the physical erasing unit 410(1) corresponding to smallest first timestamp 1300_1 (i.e., the physical erasing unit 410(1) with the timestamp recorded as "000001") from the physical erasing units 410(0)~410(F−1) and determine whether the erase count of the selected physical erasing unit 410(1) is smaller than the value obtained by subtracting the predetermined value from the average of the erase counts of the physical erasing units. Here, it is assumed that the erase count of the physical erasing unit 410(1) is determined by the memory control circuit unit 404 (or the memory management circuit 502) to be not smaller than the value obtained by subtracting the value from the average of the erase counts of the physical erasing units. Therefore, the memory control circuit unit 404 (or the memory management circuit 502) may choose the physical erasing unit 410(2) according to the timestamps in the redundant bit areas 1308 in the physical erasing units 410(0) to 410(F−1) in the data area 602 based on a sequence from the smallest to the greatest and perform the operation of determining the erase count. Similarly, after the memory control circuit unit 404 (or the memory management circuit 502) selects the first physical erasing unit according to the timestamps and the erase counts and select the second physical erasing unit with the greatest erase count according to the erase counts of the physical erasing units, the memory control circuit unit 404 (or the memory management circuit 502) may perform the wear leveling operation to write the data of the first physical erasing unit to the second physical erasing unit, associate the second physical erasing unit with the data area 602, and associate the first physical erasing unit with the spare area 604. Here, the wear leveling operation is the same as the wear leveling operation described in FIGS. 10A and 10B of the first exemplary embodiment, and thus not repeated in the following.

In view of the foregoing, according to the wear leveling method of the invention, the wear leveling process is performed to the physical erasing unit originally having a greater erase count and the physical erasing unit whose data are not modified for a long time. Thus, the probability that the physical erasing unit originally having a greater erase count is erased subsequently is lowered, and the physical erasing unit originally having a smaller erase count is associated with the spare area as a physical erasing unit to be alternately used. Thus, the wear levels of the physical erasing units are more uniform and the lifetime of the memory storage system is prolonged. The previously described exemplary embodiments of the invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wear leveling method for a rewritable non-volatile memory module, wherein the rewritable non-volatile memory module comprises a plurality of physical erasing units, the wear leveling method comprising:

recording a timestamp for each of the physical erasing units storing valid data according to a programming sequence of physical erasing units storing valid data among the physical erasing units;

recording an erase count for each of the physical erasing units;

selecting a first physical erasing unit from the physical erasing units storing valid data according to the timestamps of the physical erasing units;

getting a second physical erasing unit from the physical erasing units not storing valid data according to the erase count of each of the physical erasing units; and writing the valid data in the first physical erasing unit into the second physical erasing unit and marking the first physical erasing unit as a physical erasing unit not storing valid data.

2. The wear leveling method as claimed in claim 1, wherein the step of recording the timestamp for each of the physical erasing units storing valid data according to the programming sequence of the physical erasing units storing valid data among the physical erasing units comprises:

configuring a plurality of logical addresses, wherein the logical addresses map to the physical erasing units storing the valid data;

setting up a queue;

programming a first data belonging to a first logical address of the logical addresses to a physical erasing unit of the physical erasing units;

recording the physical erasing unit that the first data is programmed to in the queue;

after programming the first data, programming a second data belonging to a second logical address of the logical addresses to a physical erasing unit among the physical erasing units; and recording the physical erasing unit that the second data is programmed to in the queue, wherein the queue has a first end and a second end, and there are a plurality of positions between the first end to the second end, wherein in the queue, a position recording the physical erasing unit where that the first data is programmed to follows a position recording the physical erasing unit that the second data is programmed to, and a distance between the position recording the physical erasing unit that the first data is programmed to and the first end is greater than a distance between the position recording the physical erasing unit that the second data is programmed to and the first end.

3. The wear leveling method as claimed in claim 2, wherein the step of selecting the first physical erasing unit from the physical erasing units storing the valid data according to the timestamps of the physical erasing units includes:
  (a) selecting a physical erasing unit from the second end of the queue according to the sequence;
  (b) determining whether the erase count of the selected physical erasing unit is smaller than a value obtained by subtracting a predetermined value from an average of the erase counts of the physical erasing units;
  (c) if the erase count of the selected physical erasing unit is smaller than the value obtained by subtracting the predetermined value from the average of the erase counts of the physical erasing units, using the selected physical erasing unit as the first physical erasing unit; and
  (d) if the erase count of the selected physical erasing unit is not smaller than the value obtained by subtracting the predetermined value from the average of the erase counts of the physical erasing units, selecting a next physical erasing unit from the second end of the queue according to the sequence and performing the step (b).

4. The wear leveling method as claimed in claim 1, wherein the step of recording the timestamp for each of the physical erasing units storing valid data according to the programming sequence of the physical erasing units storing valid data among the physical erasing units comprises:
  configuring a plurality of logical addresses, wherein the logical addresses map to the physical erasing units storing valid data;
  programming a first data belonging to a first logical address of the logical addresses to a physical erasing unit among the physical erasing units;
  recording the timestamp corresponding to the physical erasing unit that the first data is programmed to as a first timestamp in a programming sequence table;
  after programming the first data, programming a second data belonging to a second logical address of the logical addresses to a physical erasing unit among the physical erasing units; and
  recording the timestamp corresponding to the physical erasing unit that the second data is programmed to as a second timestamp in the programming sequence table,
  wherein the first timestamp is smaller than the second timestamp.

5. The wear leveling method as claimed in claim 4, wherein the step of selecting the first physical erasing unit from the physical erasing units storing valid data according to the timestamps of the physical erasing units includes:
  (a) selecting the physical erasing unit corresponding to the smallest timestamp according to the timestamps recorded in the programming sequence table;
  (b) determining whether the erase count of the selected physical erasing unit is smaller than a value obtained by subtracting a predetermined value from an average of the erase counts of the physical erasing units;
  (c) if the erase count of the selected physical erasing unit is smaller than the value obtained by subtracting the predetermined value from the average of the erase counts of the physical erasing units, using the selected physical erasing unit as the first physical erasing unit; and
  (d) if the erase count of the selected physical erasing unit is not smaller than the value obtained by subtracting the predetermined value from the average of the erase counts of the physical erasing units, selecting the physical erasing unit corresponding to a next timestamp based on the timestamps recorded in the programming sequence table according to a sequence from the smallest to the greatest and performing the step (b).

6. The wear leveling method as claimed in claim 1, wherein each of the physical erasing units comprises a plurality of physical programming units, each of the physical programming units comprises a data bit area and a redundant bit area, and the step of recording the timestamp for each of the physical erasing units storing valid data according to the programming sequence of the physical erasing units storing valid data among the physical erasing units comprises:
  configuring a plurality of logical addresses, wherein the logical addresses map to the physical erasing units storing valid data;
  programming a first data belonging to a first logical address of the logical addresses to a physical erasing unit among the physical erasing units;
  recording a first timestamp in the redundant bit area of the physical erasing unit that the first data is programmed to;
  after programming the first data, programming a second data belonging to a second logical address of the logical addresses to a physical erasing unit among the physical erasing units; and
  recording a second timestamp in the redundant bit area of the physical erasing unit that the second data is programmed to;
  wherein the first timestamp is smaller than the second timestamp.

7. The wear leveling method as claimed in claim 6, wherein the step of selecting the first physical erasing unit from the physical erasing units storing valid data according to the timestamps of the physical erasing units includes:
  (a) selecting the physical erasing unit with the smallest timestamp according to the timestamps in the redundant bit areas of the physical erasing units storing valid data;
  (b) determining whether the erase count of the selected physical erasing unit is smaller than a value obtained by subtracting a predetermined value from an average of the erase counts of the physical erasing units;
  (c) if the erase count of the selected physical erasing unit is smaller than the value obtained by subtracting the predetermined value from the average of the erase counts of the physical erasing units, using the selected physical erasing unit as the first physical erasing unit; and
  (d) if the erase count of the selected physical erasing unit is not smaller than the value obtained by subtracting the predetermined value from the average of the erase counts of the physical erasing units, selecting the physical erasing unit corresponding to a next timestamp based on the timestamps recorded in the redundant bit areas of the physical erasing units storing valid data according to a sequence from the smallest to the greatest and performing the step (b).

8. A memory control circuit unit for controlling a rewritable non-volatile memory module, wherein the rewritable non-volatile memory module comprises a plurality of physical erasing units, the memory control circuit unit comprising:
  a host interface configured to couple to a host system;
  a memory interface configured to couple to the rewritable non-volatile memory module; and
  a memory management circuit coupled to the host interface and the memory interface, wherein the memory management circuit records a timestamp for each of the physical erasing units storing valid data according to a programming sequence of the physical erasing units storing valid data of the physical erasing units, wherein the memory management circuit further records an erase count for each of the physical erasing units, wherein the memory management circuit further selects a first physical erasing unit from the physical erasing units storing valid data according to the timestamps of the physical erasing units, wherein the memory management circuit further gets a second physical erasing unit from the physical erasing units not storing valid data according to the erase count of each of the physical erasing units, wherein the memory management circuit further sends a first command sequence, wherein the first command sequence instructs to write the valid data in the first physical erasing unit into the second physical erasing unit, and the memory management circuit marks the first physical erasing unit as a physical erasing unit not storing valid data.

9. The memory control circuit unit as claimed in claim 8, wherein in the operation of recording the timestamp for each of the physical erasing units storing valid data according to the programming sequence of the physical erasing units storing the valid data among the physical erasing units, the memory management circuit further configures a plurality of logical addresses, and the logical addresses map to the physical erasing units storing valid data, wherein the memory management circuit further sets up a queue, wherein the memory management circuit further sends a second command sequence, and the second command sequence instructs to program a first data belonging to a first logical address of the logical addresses to a physical erasing unit among the physical erasing units, wherein the memory management circuit further records the physical erasing unit that the first data is programmed to in the queue, wherein after programming the first data, the memory management circuit further sends a third command sequence, and the third command sequence instructs to program a second data belonging to a second logical address of the logical addresses to a physical erasing unit among the physical erasing units, wherein the memory management circuit further records the physical erasing unit that the second data is programmed to in the queue, wherein the queue has a first end and a second end, and there are a plurality of positions between the first end to the second end, wherein in the queue, a position recording the physical erasing unit that the first data is programmed to follows a position recording the physical erasing unit that the second data is programmed to, and a distance between the position recording the physical erasing unit that the first data is programmed to and the first end is greater than a distance between the position recording the physical erasing unit that the second data is programmed to and the first end.

10. The memory control circuit unit as claimed in claim 9, wherein in the operation of selecting the first physical erasing unit from the physical erasing units storing valid data according to the timestamps of the physical erasing units, the memory management circuit further selects a physical erasing unit from the second end of the queue, wherein the memory management circuit further performs an operation of determining the erase count to determine whether the erase count of the selected physical erasing unit is smaller than a value obtained by subtracting a predetermined value from an average of the erase counts of the physical erasing units, wherein if the erase count of the selected physical erasing unit is smaller than the value obtained by subtracting the predetermined value from the average of the erase counts of the physical erasing units, the memory management circuit uses the selected physical erasing unit as the first physical erasing unit, wherein if the erase count of the selected physical erasing units is not smaller than the value obtained by subtracting the predetermined value from the average of the erase counts of the physical erasing units, the memory management circuit selects a next physical erasing unit from the second end of the queue according to a sequence and performs the operation of determining the erase count.

11. The memory control circuit unit as claimed in claim 8, wherein in the operation of recording the timestamp for each of the physical erasing units storing valid data according to the programming sequence of the physical erasing units storing valid data among the physical erasing units, the memory management circuit further configures a plurality of logical addresses, and the logical addresses map to the physical erasing units storing valid data, wherein the memory management circuit further sends a second command sequence, and the second command sequence instructs to program a first data belonging to a first logical address of the logical addresses to a physical erasing unit among the physical erasing units, wherein the memory management circuit further records the timestamp corresponding to the physical erasing unit that the first data is programmed to as a first timestamp in a programming sequence table, wherein after programming the first data, the memory management circuit further sends a third command sequence, and the third command sequence instructs to program a second data belonging to a second logical address of the logical addresses to a physical erasing unit among the physical erasing units, wherein the memory management circuit further records the timestamp corresponding to the physical erasing unit that the second data is programmed to as a second timestamp in the programming sequence table, wherein the first timestamp is smaller than the second timestamp.

12. The memory control circuit unit as claimed in claim 11, wherein in the operation of selecting the first physical erasing unit among the physical erasing units storing valid data according to the timestamps of the physical erasing units, the memory management circuit further selects the physical erasing unit corresponding to the smallest timestamp according to the timestamps recorded in the programming sequence table, wherein the memory management circuit further performs an operation of determining the erase count to determine whether the erase count of the selected physical erasing unit is smaller than a value obtained by subtracting a predetermined value from an average of the erase counts of the physical erasing units, wherein if the erase count of the selected physical erasing unit is smaller than the value obtained by subtracting the predetermined value from the average of the erase counts of the physical erasing units, the memory management circuit uses the selected physical erasing unit as the first physical erasing unit, wherein if the erase count of the selected physical erasing units is not smaller than the value obtained by subtracting the predetermined value from the average of the erase counts of the physical erasing units, the memory management circuit selects the physical erasing unit corresponding to a next timestamp based on the timestamps recorded in the programming sequence table according to a sequence from the smallest to the greatest and performs operation of determining the erase count.

13. The memory control circuit unit as claimed in claim 8, wherein each of the physical erasing units comprises a plurality of physical programming units, each of the physical programming units comprises a data bit area and a redundant bit area, and in the operation of recording the timestamp for each of the physical erasing units storing valid data according to the programming sequence of the physical erasing units storing valid data among the physical erasing units, the memory management circuit further configures a plurality of logical addresses, and the logical addresses map to the physical erasing units storing valid data, wherein the memory management circuit further sends a second command sequence, and the second command sequence instructs to program a first data belonging to a first logical address of the logical addresses to a physical erasing unit among the physical erasing units, wherein the redundant bit area of the physical erasing unit that the first data is programmed to records a first timestamp, wherein after programming the first data, the memory management circuit further sends a third command sequence, and the third command sequence instructs to program a second data belonging to a second logical address of the logical addresses to a physical erasing unit among the physical erasing units, wherein the redundant bit area of the physical erasing unit that the second data is programmed to records a second timestamp, wherein the first timestamp is smaller than the second timestamp.

14. The memory control circuit unit as claimed in claim 13, wherein in the operation of selecting the first physical erasing unit of the physical erasing units storing valid data according to the timestamps of the physical erasing units, the memory management circuit further selects the physical erasing unit with the smallest timestamp according to the timestamps in the redundant bit areas of the physical erasing units storing valid data, wherein the memory management circuit further performs an operation of determining the erase count to determine whether the erase count of the selected physical erasing unit is smaller than a value obtained by subtracting a predetermined value from an average of the erase counts of the physical erasing units, wherein if the erase count of the selected physical erasing unit is smaller than the value obtained by subtracting the predetermined value from the average of the erase counts of the physical erasing units, the memory management circuit uses the selected physical erasing unit as the first physical erasing unit, wherein if the erase count of the selected physical erasing units is not smaller than the value obtained by subtracting the predetermined value from the average of the erase counts of the physical erasing units, the memory management circuit selects the physical erasing unit corresponding to a next timestamp based on the timestamps recorded in the redundant bit areas of the physical erasing units storing valid data according to a sequence from the smallest to the greatest and performs the operation of determining the erase count.

15. A memory storage device, comprising:
a connecting interface unit configured to couple to a host system;
a rewritable non-volatile memory module comprising a plurality of physical erasing units; and
a memory control circuit unit coupled to the connecting interface unit and the rewritable non-volatile memory module,
wherein the memory control circuit unit records a timestamp for each of the physical erasing units storing valid data according to a programming sequence of the physical erasing units storing valid data among the physical erasing units, wherein the memory control circuit unit further records an erase count for each of the physical erasing units,
wherein the memory control circuit unit further selects a first physical erasing unit from the physical erasing units storing valid data according to the timestamps of the physical erasing units,
wherein the memory control circuit unit further gets a second physical erasing unit from the physical erasing units not storing valid data according to the erase count of each of the physical erasing units,
wherein the memory control circuit unit further sends a first command sequence, the first command sequence instructs to write the valid data in the first physical erasing unit into the second physical erasing unit, and the memory control circuit unit marks the first physical erasing unit as a physical erasing unit not storing valid data.

16. The memory storage device as claimed in claim 15, wherein in the operation of recording the timestamp for each of the physical erasing units storing valid data according to the programming sequence of the physical erasing units storing the valid data among the physical erasing units, the memory control circuit unit further configures a plurality of logical addresses, and the logical addresses map to the physical erasing units storing valid data, wherein the memory control circuit unit further sets up a queue, wherein the memory control circuit unit further sends a second command sequence, the second command sequence instructs to program a first data belonging to a first logical address of the logical addresses to a physical erasing unit among the physical erasing units, wherein the memory control circuit unit further records the physical erasing unit that the first data is programmed to in the queue, wherein after programming the first data, the memory control circuit unit further sends a third command sequence, and the third command sequence instructs to program a second data belonging to a second logical address of the logical addresses to a physical erasing unit among the physical erasing units, wherein the memory control circuit unit further records the physical erasing unit that the second data is programmed to in the queue, wherein the queue has a first end and a second end, and there are a plurality of positions between the first end to the second end, wherein in the queue, a position recording the physical erasing unit that the first data is programmed to follows a position recording the physical erasing unit that the second data is programmed to, and a distance between the position recording the physical erasing unit that the first data is programmed to and the first end is greater than a distance between the position recording the physical erasing unit that the second data is programmed to and the first end.

17. The memory storage device as claimed in claim 16, wherein in the operation of selecting the first physical erasing unit from the physical erasing units storing valid data according to the timestamps of the physical erasing units, the memory control circuit unit further selects a physical erasing unit from the second end of the queue, wherein the memory control circuit unit further performs an operation of determining the erase count to determine whether the erase count of the selected physical erasing unit is smaller than a value obtained by subtracting a predetermined value from an average of the erase counts of the physical erasing units, wherein if the erase count of the selected physical erasing unit is smaller than the value obtained by subtracting the predetermined value from the average of the erase counts of the physical erasing units, the memory control circuit unit uses the selected physical erasing unit as the first physical erasing unit, wherein if the erase count of the selected physical erasing units is not smaller than the value obtained by subtracting the predetermined value from the average of the erase counts of the physical erasing units, the memory control circuit unit selects a next physical erasing unit from the second end of the queue according to a sequence and performs the operation of determining the erase count.

18. The memory storage device as claimed in claim 15, wherein in the operation of recording the timestamp for each of the physical erasing units storing valid data according to the programming sequence of the physical erasing units storing the valid data among the physical erasing units, the memory control circuit unit further configures a plurality of logical addresses, and the logical addresses map to the physical erasing units storing valid data, wherein the memory control circuit unit further sends a second command sequence, the second command sequence instructs to program a first data belonging to a first logical address of the logical addresses to a physical erasing unit among the physical erasing units, wherein the memory control circuit unit further records the timestamp corresponding to the physical erasing unit that the first data is programmed to as a first timestamp in a programming sequence table, wherein after programming the first data, the memory control circuit unit further sends a third command sequence, and the third command sequence instructs to program a second data belonging to a second logical address of the logical addresses to a physical erasing unit among the physical erasing units, wherein the memory control circuit unit further records the timestamp corresponding to the physical erasing unit that the second data is programmed to as a second timestamp in the programming sequence table, wherein the first timestamp is smaller than the second timestamp.

19. The memory storage device as claimed in claim 18, wherein in the operation of selecting the first physical erasing unit among the physical erasing units storing valid data according to the timestamps of the physical erasing units, the memory control circuit unit further selects the physical erasing unit corresponding to the smallest timestamp according to the timestamps recorded in the programming sequence table, wherein the memory control circuit unit further performs an operation of determining the erase count to determine whether the erase count of the selected physical erasing unit is smaller than a value obtained by subtracting a predetermined value from an average of the erase counts of the physical erasing units, wherein if the erase count of the selected physical erasing unit is smaller than the value obtained by subtracting the predetermined value from the average of the erase counts of the physical erasing units, the memory control circuit unit uses the selected physical erasing unit as the first physical erasing unit, wherein if the erase count of the selected physical erasing units is not smaller than the value obtained by subtracting the predetermined value from the average of the erase counts of the physical erasing units, the memory control circuit unit selects the physical erasing unit corresponding to a next timestamp based on the timestamps recorded in the programming sequence table according to a sequence from the smallest to the greatest and performs operation of determining the erase count.

20. The memory storage device as claimed in claim 15, wherein each of the physical erasing units comprises a plurality of physical programming units, each of the physical programming units comprises a data bit area and a redundant bit area, and in the operation of recording the timestamp for each of the physical erasing units storing valid data according to the programming sequence of the physical erasing units storing valid data among the physical erasing units, the memory control circuit further configures a plurality of logical addresses, wherein the logical addresses map to the physical erasing unit storing valid data;

wherein the memory control circuit unit further sends a second command sequence, and the second command sequence instructs to program a first data belonging to a first logical address of the logical addresses to a physical erasing unit among the physical erasing units, wherein the redundant bit area of the physical erasing unit that the first data is programmed to records a first timestamp, wherein after programming the first data, the memory control circuit unit further sends a third command sequence, and the third command sequence instructs to program a second data belonging to a second logical address of the logical addresses to a physical erasing unit among the physical erasing units, wherein the redundant bit area of the physical erasing unit that the second data is programmed to records a second timestamp, wherein the first timestamp is smaller than the second timestamp.

21. The memory storage device as claimed in claim 20, wherein in the operation of selecting the first physical erasing unit among the physical erasing units storing valid data according to the timestamps of the physical erasing units, the memory control circuit unit further selects the physical erasing unit with the smallest timestamp according to the timestamps in the redundant bit areas of the physical erasing units storing valid data, wherein the memory control circuit unit further performs an operation of determining the erase count to determine whether the erase count of the selected physical erasing unit is smaller than a value obtained by subtracting a predetermined value from an average of the erase counts of the physical erasing units, wherein if the erase count of the selected physical erasing unit is smaller than the value obtained by subtracting the predetermined value from the average of the erase counts of the physical erasing units, the memory control circuit unit uses the selected physical erasing unit as the first physical erasing unit, wherein if the erase count of the selected physical erasing units is not smaller than the value obtained by subtracting the predetermined value from the average of the erase counts of the physical erasing units, the memory control circuit unit selects the physical erasing unit corresponding to a next timestamp based on the timestamps recorded in the redundant bit areas of the physical erasing units storing valid data according to a sequence from the smallest to the greatest and performs the operation of determining the erase count.

* * * * *